(12) United States Patent
Koeck et al.

(10) Patent No.: US 11,380,763 B2
(45) Date of Patent: Jul. 5, 2022

(54) CONTACT STRUCTURES FOR N-TYPE DIAMOND

(71) Applicants: Franz A. Koeck, Tempe, AZ (US); Robert Nemanich, Scottsdale, AZ (US)

(72) Inventors: Franz A. Koeck, Tempe, AZ (US); Robert Nemanich, Scottsdale, AZ (US)

(73) Assignee: Arizona Board of Regents on behalf of Arizona State University, Scottsdale, AZ (US)

( * ) Notice: Subject to any disclaimer, the term of this patent is extended or adjusted under 35 U.S.C. 154(b) by 0 days.

(21) Appl. No.: 16/860,512

(22) Filed: Apr. 28, 2020

(65) Prior Publication Data

US 2020/0343344 A1    Oct. 29, 2020

Related U.S. Application Data

(60) Provisional application No. 62/839,857, filed on Apr. 29, 2019.

(51) Int. Cl.

| | |
|---|---|
| *H01L 29/86* | (2006.01) |
| *H01L 29/16* | (2006.01) |
| *H01L 29/06* | (2006.01) |
| *H01L 29/66* | (2006.01) |
| *H01L 29/868* | (2006.01) |

(52) U.S. Cl.
CPC ...... *H01L 29/1602* (2013.01); *H01L 29/0665* (2013.01); *H01L 29/6603* (2013.01); *H01L 29/6609* (2013.01); *H01L 29/868* (2013.01)

(58) Field of Classification Search
CPC combination set(s) only.
See application file for complete search history.

(56) References Cited

U.S. PATENT DOCUMENTS

| | | |
|---|---|---|
| 9,922,791 B2 | 3/2018 | Koeck et al. |
| 10,121,657 B2 | 11/2018 | Koeck et al. |
| 10,418,475 B2 | 9/2019 | Chowdhury et al. |

(Continued)

OTHER PUBLICATIONS

Abe et al., "Guest Editorial Special Issue on Vacuum Electronics," IEEE Transactions on Electron Devices, vol. 65, No. 3, Jun. 2018, pp. 2058-2060.

(Continued)

*Primary Examiner* — Moin M Rahman
(74) *Attorney, Agent, or Firm* — Withrow & Terranova, P.L.L.C.

(57) ABSTRACT

Electronic devices and more particularly diamond-based electronic devices and corresponding contact structures are disclosed. Electrical contact structures to diamond layers, including n-type, phosphorus doped single-crystal diamond are disclosed. In particular, electrical contact structures are formed through an arrangement of one or more nanostructured carbon layers with high nitrogen incorporation that are provided between metal contacts and n-type diamond layers in diamond-based electronic devices. Nanostructured carbon layers may be configured to mitigate reduced phosphorus incorporation in n-type diamond layers, thereby providing low specific contact resistances for corresponding devices. Diamond p-i-n diodes for direct electron emission applications are also disclosed that include electrical contact structures with nanostructured carbon layers.

31 Claims, 13 Drawing Sheets

(56) References Cited

U.S. PATENT DOCUMENTS

| | | | |
|---|---|---|---|
| 10,704,160 B2 | 7/2020 | Koeck et al. | |
| 2006/0220026 A1* | 10/2006 | Uchida | H01L 21/049 257/77 |
| 2008/0206576 A1* | 8/2008 | Qian | C04B 35/52 428/446 |
| 2010/0308343 A1* | 12/2010 | Suzuki | H01L 29/7395 257/77 |
| 2011/0233560 A1* | 9/2011 | Koike | H01L 29/47 257/77 |
| 2011/0241045 A1* | 10/2011 | Ye | H01L 33/20 257/98 |
| 2015/0200265 A1* | 7/2015 | Kumano | H01L 24/03 257/472 |
| 2015/0236097 A1* | 8/2015 | Suzuki | H01L 29/6603 257/77 |
| 2016/0043260 A1 | 2/2016 | Nemanich et al. | |
| 2016/0126317 A1* | 5/2016 | Kim | H01L 21/02573 257/29 |
| 2016/0172449 A1* | 6/2016 | Suzuki | H01L 29/267 257/77 |
| 2017/0047468 A1 | 2/2017 | Sumant et al. | |
| 2018/0204702 A1 | 7/2018 | Koeck et al. | |
| 2018/0204941 A1* | 7/2018 | Odnoblyudov | H01L 21/02458 |
| 2019/0348284 A1* | 11/2019 | Miyazaki | H01L 29/1602 |
| 2020/0119207 A1 | 4/2020 | Holmes et al. | |

OTHER PUBLICATIONS

Achatz et al., "Effect of nitrogen on the electronic properties of ultrananocrystalline diamond thin films grown on quartz and diamond substrates," Physical Reivew B, vol. 74, No. 15, 2006, pp. 155429-1-155429-7.

Arenal et al., "Diamond nanowires and the insulator-metal transition in ultrananocrystalline diamond films," Physical Review B, vol. 75, 2007, pp. 195431-1-195431-11.

Bandis et al., "Photoelectric emission from negative-electron-affinity diamond (111) surfaces: Exciton breakup versus conduction-band emission," Physical Review B, vol. 52, No. 16, Oct. 15, 1995, pp. 12056-12071.

Baraskar et al., "Lower limits to metal-semiconductor contact resistance: Theoretical models and experimental data," Journal of Applied Physics, vol. 114, No. 15, 2013, pp. 154516-1-154516-9.

Bhattacharyya et al., "Synthesis and characterization of highly-conducting nitrogen-doped ultrananocrystalline diamond films," Applied Physics Letters, vol. 79, No. 10, Sep. 3, 2001, pp. 1441-1443.

Bhattacharyya, S., "Mechanism of high n-type conduction in nitrogen-doped nanocrystalline diamond," Physical Review B, vol. 70, No. 12, Sep. 16, 2004, pp. 125412-1-125412-10.

Birrell et al., "Bonding structure in nitrogen doped ultrananocrystalline diamond," Journal of Applied Physics, vol. 93, No. 9, May 1, 2003, pp. 5606-5612.

Booske et al., "Vacuum Electronic High Power Terahertz Sources," IEEE Transactions on Terahertz Science and Technology, vol. 1, No. 1, Sep. 2011, pp. 54-75.

Chen et al., "Investigation of specific contact resistance of ohmic contacts to B-doped homoepitaxial diamond using transmission line model," Diamond and Related Materials, vol. 13, No. 11-12, Nov.-Dec. 2004, pp. 2121-2124.

Chen et al., "The structure and electrochemical behavior of nitrogen-containing nanocrystalline diamond films deposited from CH4/N2/Ar mixtures," Journal of The Electrochemical Society, vol. 148, No. 1, 2001, pp. E44-E51.

Civrac et al., "Electrical and mechanical characterisation of Si/Al ohmic contacts on diamond," Electronic Letters, vol. 46, No. 11, May 27, 2010, pp. 791-793.

Demlow et al., "The effect of substrate temperature and growth rate on the doping efficiency of single crystal boron doped diamond," Diamond and Related Materials, vol. 49, Oct. 2014, pp. 19-24.

Fujimori et al., "Properties of boron-doped epitaxial diamond films," Japanese Journal of Applied Physics, vol. 29, No. 5, May 1990, pp. 824-827.

Geis et al., U.S. Appl. No. 16/573,187, filed Sep. 17, 2019.

Gerbi et al., "Electrical contacts to ultrananocrystalline diamond," Apllied Physics Letters, vol. 83, No. 10, Sep. 8, 2003, pp. 2001-2003.

Grotjohn et al., "Heavy phosphorus doping by epitaxial growth on the (111) diamond surface," Diamond and Related Materials, vol. 44, Apr. 2014, pp. 129-133.

Himpsel et al., "Quantum photoyield of diamond(111)—A stable negative-affinity emitter," Physical Review B, nol. 20, No. 2, Jul. 15, 1979, pp. 624-627.

Jeedigunta et al., "Electrical contacts to nitrogen incorporated nanocrystalline diamond films," Diamond and Related Materials, vol. 17, No. 12, Dec. 2008, pp. 2037-2040.

Kang et al., "True Material Limit of Power Devices—Applied to 2-D Superjunction MOSFET," IEEE Transactions on Electron Devices, vol. 65, No. 4, Apr. 2018, pp. 1432-1439.

Kato et al., "n-type doping of (001)—oriented single-crystalline diamond by phosphorus," Applied Physics Letters, vol. 86, No. 22, Jun. 2005, pp. 222111-1-222111-3.

Kato et al., "Selective Growth of Buried n+ Diamond on (001) Phosphorus-Doped n-Type Diamond Film," Applied Physics Express, vol. 2, No. 5, pp. 055502-1-055502-3.

Kawashima et al., "Desorption time of phosphorus during MPCVD growth of n-type (001) diamond," Diamond and Related Materials, vo. 64, Apr. 2016, pp. 208-212.

Koizumi et al., "Growth and characterization of phosphorous doped (111) homoepitaxial diamond thin films," Applied Physics Letters, vol. 71, No. 8, Aug. 25, 1997, pp. 1065-1067.

Kono et al., "Images and energy distributions of electrons emitted from a diamond pn-junction diode," e-Journal of Surface Science and Nanotechnology, vol. 7, May 30, 2009, pp. 660-664.

Liu et al., "Structural and electrical properties of nanocrystalline diamond (NOD) heavily doped by nitrogen," Diamond & Related Material, vol. 14, No. 11-12, Nov.-Dec. 2005, pp. 2059-2063.

Makino et al., "Electrical and light-emitting properties of homoepitaxial diamond p-i-n junction," Physica Status Solidi (A), vol. 205, No. 9, Aug. 22, 2008, pp. 2200-2206.

Mortet et al., "Properties of boron-doped epitaxial diamond layers grown on (110) oriented single crystal substrates," Diamond and Related Materials, vol. 53, Mar. 2015, pp. 29-34.

Ohtani et al., "Large improvement of phosphorus incorporation efficiency in n-type chemical vapor deposition of diamond," Applied Physics Letters, vol. 105, Dec. 2014, pp. 232106-1-232106-3.

Shimoda et al., "Electrical contacts to nanocrystalline diamond films studied at high temperatures," Journal of Applied Physics, vol. 120, Dec. 20, 2016, pp. 235706-1-235706-6.

Shiomi et al., "Characterization of Boron-Doped Diamond Epitaxial Films," Japanese Journal of Applied Physics, vol. 30, No. 7, Jul. 1991, pp. 1363-1366.

Takeuchi et al., "4 A/cm2, 7kV normally-off diamond-emitter vacuum switch," 2015, IEEE 27th International Symposium on Power Semiconductor Devices & IC's (ISPSD), May 10-14, 2015, Hong Kong, pp. 197-200.

Takeuchi et al., "Electron Emission from a Diamond (111) p-i-n+ Junction Diode with Negative Electron Affinity during Room Temperature Operation," Applied Physics Express, vol. 3, No. 4, 2010, pp. 041301-1-041301-3.

Takeuchi et al., "Photoelectron emission from diamond," Physica Status Solidi (A), vol. 203, No. 12, Sep. 13, 2006, pp. 3100-3106.

Takeuchi et al., "Photoelectron emission properties of hydrogen terminated intrinsic diamond," Journal of Applied Physics, vol. 99, Apr. 20, 2006, pp. 086102-1-086102-3.

Temahuki et al., "New Process for Electrical Contacts on (100) N-type Diamond," Physica Status Solidi A , 2017, 1700466, 6 pages.

Van Der Weide et al., "Angle-resolved photoemission of diamond (111) and (100) surfaces; negative electron affinity and band structure measurements," Journal of Vacuum Science and Technology B, vol. 12, 1994, pp. 2475-2479.

(56) References Cited

OTHER PUBLICATIONS

Van Der Weide et al., "Negative-electron-affinity effects on the diamond (100) surface," Physical Review B, vol. 50, No. 8, Aug. 15, 1994, pp. 5803-5806.
Williams et al., "n-type conductivity in ultrananocrystalline diamond films," Applied Physics Letters, vol. 85, No. 10, Sep. 6, 2004, pp. 1680-1682.
Wort et al., "Diamond as an electronic material," Materials Today, vol. 11, No. 1-2, Jan.-Feb. 2008, pp. 22-28.
Zapol et al., "Tight-binding molecular-dynamics simulation of impurities in ultrananocrystalline diamond grain boundaries," Physical Review B, vol. 65, No. 4, Jan. 15, 2002, pp. 045403-1-045403-11.
Zhou et al., "Control of diamond film microstructure by Ar additions to CH4/H2 microwave plasmas," Journal of Applied Physics, vol. 84, No. 4, Aug. 15, 1998, pp. 1981-1989.

\* cited by examiner

| | Si | 4H-SiC | β-Ga$_2$O$_3$ | GaN | Diamond |
|---|---|---|---|---|---|
| Bandgap | $E_g$ (eV) | 1.1 | 3.26 | 4.5-4.9 | 3.39 | 5.45 |
| Electron Concentration | $n_i$ (cm$^{-3}$) | 1.5x10$^{10}$ | 8.2x10$^{-9}$ | | 1.9x10$^{-10}$ | 1.6x10$^{-27}$ |
| Electron Mobility (high) | $\mu_n$ (cm$^2$/V s) | 1450 | 950 | 300 | 1200 | 4500 |
| Hole Mobility (high) | $\mu_p$ (cm$^2$/V s) | 430 | 120 | | 200 | 3800 |
| Electron Saturation Velocity | $v_{sat}$ (10$^7$ cm/s) | 1 | 2 | 1.3 | 2.5 | 1.5 |
| Hole Saturation Velocity | $v_{sat}$ (10$^7$ cm/s) | 0.4 | 1 | | 1.7 | 1.1 |
| Breakdown Electric Field | $E_{br}$ (MV/cm) | 0.3 | 3 | 8 | 3.3 | 10 |
| Thermal Conductivity | k (W/cm K) | 1.5 | 4.9 | 0.11-0.27 | 2.3 | 20 |
| Maximum Operating Temperature | $T_{max}$ (°C) | 175 | 500 | | 650 | 700 |
| Johnson's Figure of Merit | | 1 | 410 | | 280 | 8200 |
| Baliga's Figure of Merit | | 1 | 290 | 3444 | 910 | 17200 |

FIG. 1

| Diode | w [μm] | s [μm] |
|---|---|---|
| 26a | 50 | 100 |
| 26b | 50 | 50 |
| 26c | 100 | 50 |

US 11,380,763 B2

CONTACT STRUCTURES FOR N-TYPE DIAMOND

RELATED APPLICATIONS

This application claims the benefit of U.S. provisional patent application No. 62/839,857 filed Apr. 29, 2019, wherein the disclosure of such application is hereby incorporated by reference herein in its entirety.

GOVERNMENT RIGHTS IN INVENTION

This invention was made with government support under N00014-16-1-2929 awarded by the Office of Naval Research and 1747133 awarded by the National Science Foundation. The government has certain rights in the invention.

TECHNICAL FIELD

The present disclosure relates to electronic devices and more particularly to electronic devices with diamond layers and related contact structures.

BACKGROUND

Continued interest in diamond electronics is based on the superior properties of diamond that could enable high power devices not possible with conventional semiconductor and other wide band-gap materials. FIG. 1 details selected materials properties for typical wide band-gap semiconductor materials, including silicon (Si), 4H silicon carbide (4H-SiC), beta-gallium oxide β-$Ga_2O_3$) as an emerging semiconductor, and gallium nitride (GaN), in comparison with diamond. Power devices based on diamond would be improved through the wider band-gaps and increased breakdown voltages, high carrier mobilities, and increased thermal conductivities as compared with power devices based on typical wide band-gap semiconductor materials. Stability at high temperatures would furthermore allow operation of diamond devices in extreme ambient conditions.

Practical devices require suitable electrical contacts as they can present a limiting factor to solid state electronics and contribute to the on-resistance ($R_{on}$), an important parameter for devices. For power devices, a specific contact resistance of less than $1 \times 10^{-5}$ ohm-centimeter squared ($\Omega cm^2$) is typically required and higher frequency operation in the tera-hertz regime necessitates a further reduction of contact resistance to $1 \times 10^{-8}$ $\Omega cm^2$. As a load current ($I_{Load}$) passes through the device, power is dissipated ($P_D$) as heat energy in the amount of $P_D = I_{Load}^2 \times R_{on}$. Minimizing dissipated power losses will result in operation at lower temperatures, thus increasing efficiency and enabling more compact systems. The specific on-resistance $R_{sp}$ for silicon (Si) and silicon carbide (SiC) with respect to the breakdown voltage (VB) has been reported as derived to $R_{sp,Si} = 4.99 \times 10^{-4} \cdot VB$ [m $\Omega \cdot cm^2$] and $R_{sp,SiC} = 3.79 \times 10^{-6} \cdot VB$ [m $\Omega \cdot cm^2$], respectively in a paper titled "True Material Limit of Power Devices-Applied to 2-D Superjunction MOSFET," to Kange et al. in *IEEE Transactions on Electron Devices*, vol. 65, no. 4, pp. 1432-1439, April 2018. Based on these relations, SiC can improve the specific on-resistance over Si by about two orders of magnitude. With an increase in the operating temperature, an increase in the on-resistance is observed for SiC (at 1000 volts (V) breakdown voltage and 250° C., $R_{on}$ is increased by a factor of five) while for the same breakdown voltage and temperature the similar $R_{on}$ is reduced by a factor of about ten for diamond. This reduction of on-resistance at elevated temperatures for diamond materials represents a superior characteristic for power electronics. An immediate result emerges for applications at elevated temperatures in the form of reduced or simplified cooling requirements and improved frequency response.

Diamond devices utilizing p-type and n-type layers through boron (B) and phosphorus (P) doping, respectively, typically use electrical contacts based on a titanium (Ti)/platinum (Pt)/gold (Au) metallurgy. For boron-doped diamond, a specific contact resistance of $10^{-4}$ $\Omega cm^2$ for a boron doping concentration of $10^{18}$ $cm^{-3}$ has been reported by Chen et al. in the paper "Investigation of specific contact resistance of ohmic contacts to B-doped homoepitaxial diamond using transmission line model," Diamond and related materials 13, no. 11-12 (2004): 2121-2124, and an increase in the boron concentration to $3 \times 10^{20}$ $cm^{-3}$ resulted in a reduced specific contact resistance of $2 \times 10^{-6}$ $\Omega cm^2$ as reported by Civrac et al. in the paper "Electrical and mechanical characterisation of Si/Al ohmic contacts on diamond," Electronics Letters 46, no. 11 (2010): 791-793. With the ability to readily achieve high boron doping concentrations exceeding $10^{20}$ $cm^{-3}$ on various crystal orientations, reliable and practical electrical contacts to p-type diamond can be prepared.

Equivalent developments for n-type diamond are challenging because of difficulties in the growth of highly phosphorus doped diamond, particularly on (100) oriented surfaces that are preferred for device fabrication. First results for n-type, phosphorus doped diamond were reported by Koizumi et al. in the paper titled "Growth and characterization of phosphorous doped (111) homoepitaxial diamond thin films," Applied Physics Letters 71, no. 8 (1997): 1065-1067, where microwave plasma assisted chemical vapor deposition (CVD) was employed to incorporate phosphorus, from a phosphine source, into a (111) oriented epitaxial layer at a concentration of $2.5 \times 10^{19}$ $cm^{-3}$. Kato et al. in the paper titled "n-type doping of (001)-oriented single-crystalline diamond by phosphorus," Applied Physics Letters 86, no. 22 (2005): 222111, later reported phosphorus doped, n-type, homoepitaxial diamond on (001) oriented surfaces with a phosphorus doping concentration of ~$2 \times 10^{18}$ $cm^{-3}$. To address the reduced phosphorus incorporation, an engineered sample holder was employed to allow increased process gas flow, which resulted in an increased phosphorus incorporation for (111) oriented epitaxial layers up to $7.4 \times 10^{19}$ $cm^{-3}$. However, heavy phosphorus doping has rarely been reported. For (001) oriented Type Ib high pressure and high temperature (HPHT) diamond substrates with misorientation angles from 2.1° to 20° as substrates, a phosphorus incorporation greater than $10^{20}$ $cm^{-3}$ has been reported for epitaxial layers grown on surfaces with misorientation angles of 15° and 20° by Kawashima et al. in the paper titled "Desorption time of phosphorus during MPCVD growth of n-type (001) diamond," Diamond and Related Materials 64 (2016): 208-212. For (111) oriented substrates, a phosphorus incorporation greater than $10^{20}$ $cm^{-3}$ was reported by shifting the microwave plasma enhanced CVD process to a higher deposition pressure of 160 Torr and the deposition temperature to 950-1000° C. in the paper titled "Heavy phosphorus doping by epitaxial growth on the (111) diamond surface," to Grotjohn et al., Diamond and Related Materials 44 (2014): 129-133. With Ti/Pt/Au electrical contacts, a specific contact resistance of ~4 $\Omega cm^2$ was presented in the same paper. A different approach was reported by Hiromitsu et al. in the paper titled "Selective Growth of Buried n+ Diamond on (001) Phosphorus-Doped n-Type Diamond Film," Applied Physics Express 2 (2009) 055502, that addresses the difficulty in obtaining high phosphorus doping concentrations on (100) oriented diamond employed structural modification of the (100) surface through an etching process to enable growth of (111) crystal facets. This was demonstrated through etching of trenches oriented along [110] directions where the trench-corners presented sites for (111) oriented diamond growth thus establishing a selective growth process with a phosphorus doping concentration of ~$1\times10^{20}$ cm$^{-3}$. Ti-based electrical contacts on the regrown surface showed a specific contact resistance of ~$10^{-2}$ Ωcm$^2$. A variation in this modification of the diamond surface was also achieved through a nickel etching procedure in a hydrogen plasma followed by a nitric acid chemical etch, which resulted in inverted pyramid features across the surface. Subsequent microwave plasma CVD growth utilizing tertiarybutyl-phosphine (TBP) resulted in a phosphorus incorporation of $1\text{-}2\times10^{20}$ cm$^{-3}$ in the paper titled "New Process for Electrical Contacts on (100) N-type Diamond," to Temahuki et al., Phys. Status Solidi A 2017, 214, 1700466. This challenge in consistently preparing highly phosphorus doped diamond epitaxial layers and electrical contacts with low electrical contact resistance merits research into approaches that could address current electrical contact limitations. The art continues to seek improved diamond-based devices having desirable electrical characteristics that are capable of overcoming challenges associated with conventional devices.

SUMMARY

The present disclosure relates to electronic devices and more particularly to diamond-based electronic devices and corresponding contact structures. Electrical contact structures to diamond layers, including n-type, phosphorus doped single-crystal diamond layers are disclosed. In particular, such electrical contact structures are formed through an arrangement of one or more nanostructured carbon layers with high nitrogen incorporation that are provided between metal contacts and n-type diamond layers in diamond-based electronic devices. In certain embodiments, such nanostructured carbon layers are configured to mitigate reduced phosphorus incorporation in n-type diamond layers and provide low specific contact resistances for corresponding devices. Diamond p-i-n diodes for direct electron emission applications are also disclosed that include electrical contact structures with nanostructured carbon layers.

In one aspect, an electronic device comprises: a n-type diamond layer; a nanostructured carbon layer on the n-type diamond layer; and a metal contact layer on the nanostructured carbon layer, wherein the metal contact layer and the nanostructured carbon layer form a contact structure in conductive electrical communication with the n-type diamond layer. The nanostructured carbon layer may comprise n-type conductivity and the nanostructured carbon layer may be doped with nitrogen. In certain embodiments, the nanostructured carbon layer comprises a nitrogen concentration in a range from about $4.5\times10^{20}$ cm$^{-3}$ to about $5.5\times10^{20}$ cm$^{-3}$, or in a range from about $1\times10^{19}$ cm$^{-3}$ to about $5.5\times10^{20}$ cm$^{-3}$. In certain embodiments, the nanostructured carbon layer comprises an average grain size in a range from about 300 nm to about 500 nm, or in a range from about 10 nm to about 1000 nm, or in a range from about 10 nm to about 200 nm, or in a range from about 500 nm to about 1000 nm. The n-type diamond layer may comprise an n-type doping concentration in a range from about $2\times10^{19}$ cm$^{-3}$ to about $5\times10^{20}$ cm$^{-3}$, or in a range from about $1\times10^{17}$ cm$^{-3}$ to about $5\times10^{20}$ cm$^{-3}$. In certain embodiments, the n-type diamond layer is doped with phosphorus. The contact structure may comprise an electrical contact resistivity in a range from about $1\times10^{-3}$ Ωcm$^2$ to about $6\times10^{-3}$ Ωcm$^2$ at room temperature. The contact structure may comprise an electrical contact resistivity in a range from about $1\times10^{-3}$ Ωcm$^2$ to about $6\times10^{-3}$ Ωcm$^2$ at a temperature of about 300° C. In certain embodiments, the nanostructured carbon layer is on a surface of the n-type diamond layer that either comprises a (100) crystallographic plane or is off-axis from the (100) crystallographic plane by no more than 20 degrees. In other embodiments, the nanostructured carbon layer is on a surface of the n-type diamond layer that either comprises a (111) crystallographic plane or is off-axis from the (100) crystallographic plane by no more than 20 degrees. In other embodiments, the nanostructured carbon layer is on a surface of the n-type diamond layer that either comprises a (110) crystallographic plane or is off-axis from the (110) crystallographic plane by no more than 20 degrees. The device may further comprise a p-type diamond layer, and an intrinsic diamond layer that is arranged between the p-type diamond layer and the n-type diamond layer to form a p-i-n diode structure. In certain embodiments, the metal contact layer comprises at least one of titanium, platinum, gold, or alloys thereof. In other embodiments, the metal contact layer comprises at least one of molybdenum, tungsten, rhenium or alloys thereof.

In another aspect, a method for fabricating an electronic device comprises: forming an n-type diamond layer; depositing a nanostructured carbon layer that is doped with nitrogen on the n-type diamond layer; and depositing a metal contact layer on the nanostructured carbon layer, wherein the metal contact layer and the nanostructured carbon layer form a contact structure in conductive electrical communication with the n-type diamond layer. The method may further comprise cleaning a surface of the n-type diamond layer before said depositing of the nanostructured carbon layer. In certain embodiments, said depositing of the nanostructured carbon layer that is doped with nitrogen comprises a plasma-enhanced chemical vapor deposition (PECVD) process. In certain embodiments, a gas mixture used to deposit the nanostructured carbon layer during the PECVD process comprises at least 50% nitrogen. In certain embodiments, a gas mixture used to deposit the nanostructured carbon layer during the PECVD process comprises at least 70% nitrogen. The gas mixture used to deposit the nanostructured carbon layer during the PECVD process may further comprise argon. In certain embodiments, the gas mixture used to deposit the nanostructured carbon layer during the PECVD process comprises at least 10% hydrocarbon, such as methane with at least 10% concentration of the gas mixture.

In another aspect, an electronic device comprises: a diamond layer; a nanostructured carbon layer on the diamond layer; and a metal contact layer on the nanostructured carbon layer, wherein the metal contact layer and the nanostructured carbon layer form a contact structure in conductive electrical communication with the diamond layer. In certain embodiments, the nanostructured carbon layer comprises n-type conductivity. In certain embodiments, the nanostructured carbon layer comprises a nitrogen concentration in a range from about $1\times10^{19}$ cm$^{-3}$ to about $1\times10^{20}$ cm$^{-3}$. In certain embodiments, the nanostructured carbon layer comprises an average grain size in a range from about 10 nm to about 1000 nm. In certain embodiments, the diamond layer comprises a thickness in a range from about 500 nm to about 300 μm.

In another aspect, any one or more aspects or features described herein may be combined with any one or more other aspects or features for additional advantage. Any of the various features and elements as disclosed herein may be combined with one or more other disclosed features and elements unless indicated to the contrary herein.

Other aspects and embodiments will be apparent from the detailed description and accompanying drawings.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

FIG. 1 is a table listing selected materials properties of diamond as compared with typical wide band-gap semiconductor materials, including silicon (Si), 4H silicon carbide (4H-SiC), beta-gallium oxide ($\beta$-$Ga_2O_3$), and gallium nitride (GaN).

DETAILED DESCRIPTION

Figure 2A:
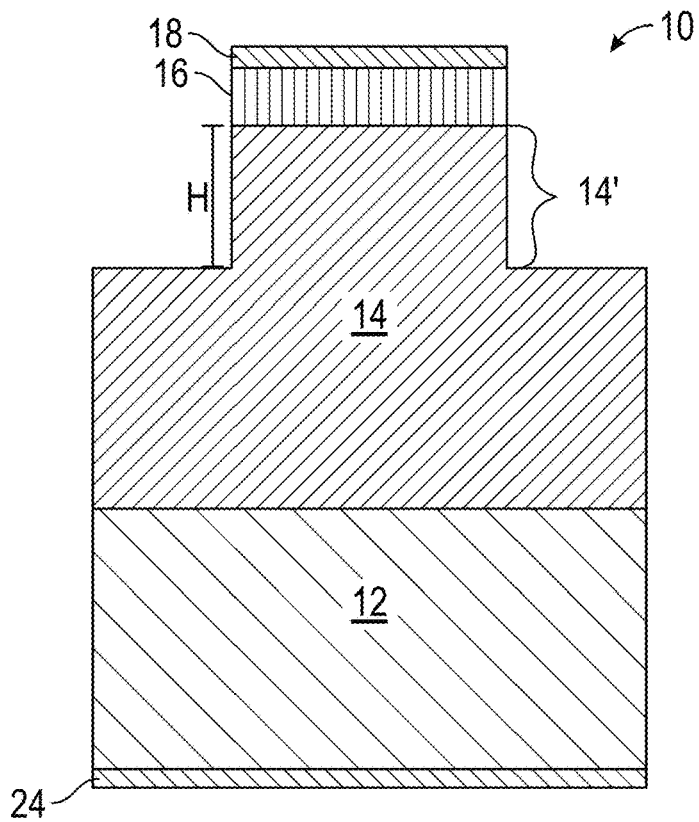
FIG. 2A is a cross-sectional illustration of a p-i-n diode that includes a p-type diamond layer, an intrinsic layer, an n-type diamond layer, and a metal contact.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to electronic devices, and more particularly to diamond-based electronic devices and corresponding contact structures. Electrical contact structures to diamond layers, including n-type, phosphorus doped single-crystal diamond are disclosed. Such electrical contact structures may be formed through an arrangement of one or more nanostructured carbon layers with high nitrogen incorporation that are provided between metal contacts and n-type diamond layers in diamond-based electronic devices. In certain embodiments, such nanostructured carbon layers are configured to mitigate reduced phosphorus incorporation in n-type diamond layers and provide low specific contact resistances for corresponding devices. Diamond p-i-n diodes for direct electron emission applications that include electrical contact structures with nanostructured carbon layers are also disclosed.

The demonstration of diamond devices has substantiated the superior capability of diamond in high power electronics that rely on the preparation of p-type and n-type diamond through boron and phosphorus doping, respectively, and the growth of high purity intrinsic diamond. According to aspects disclosed herein, electrical contacts to homoepitaxial, phosphorus doped, n-type diamond comprise an interfacial layer of highly nitrogen doped, nanostructured carbon grown by plasma enhanced chemical vapor deposition (PECVD).

By way of example, diamond-based p-i-n diodes with this contact structure were prepared for electron source applications. As described below, fabrication steps for such diamond-based p-i-n diodes are provided that include certain growth conditions such as growth time, temperature, pressure, and gas flow (among others) and other post-growth fabrication steps including various cleaning, etching, and characterization methods. It is understood that specific values provided herein may vary from tool to tool depending on many parameters, such as different tool types, differently calibrated tools, and different ages of certain tools. In this regard, the specific values listed below are provided as an example for fabricating diamond-based p-i-n diodes. In practice, other values may be utilized without deviating from the principles disclosed herein.

A diamond p-i-n diode with nano-carbon structure was prepared on HPHT Type Ib (111) oriented diamond substrates with intrinsic diamond layers, an n-type diamond layer, and nanostructured carbon layers grown in dedicated PECVD systems. The nanostructured nitrogen doped carbon layer was synthesized under argon addition to promote re-nucleation. In certain embodiments, the gas mixture or chemistry for the nanostructured carbon layer doped with nitrogen may comprise a high nitrogen concentration. In certain embodiments, the gas mixture used to deposit the nanostructured carbon layer may comprise at least 50% nitrogen, or at least 70% nitrogen. In certain embodiments, the gas mixture used to deposit the nanostructured carbon layer may comprise at least 70% nitrogen, about 4% hydrogen, about 7% argon, and about 15% of a hydrocarbon such as methane, and provides a corresponding nanostructured carbon layer that includes a nitrogen doping concentration of $\sim 5e^{20}$ $cm^{-3}$. In certain embodiments, the gas mixture may comprise at least 10% hydrocarbon. In certain embodiments, the nitrogen doping concentration of the nanostructured carbon layer is in a range from $4.5 \times 10^{20}$ $cm^{-3}$ to $5.5 \times 10^{20}$ $cm^{-3}$, or in a range from about $1 \times 10^{18}$ $cm^{-3}$ to about $1 \times 10^{21}$ $cm^{-3}$, or in a range from about $1 \times 10^{19}$ $cm^{-3}$ to about $5.5 \times 10^{20}$ $cm^{-3}$. Diamond p-i-n diodes with nano-carbon structure were prepared by lithography and mesa-etched devices contacted by Ti/Pt/Au metallurgy. Final processing in a hydrogen plasma established negative electron affinity properties for electron emission. Electrical characterization of the diamond p-i-n diodes commenced in vacuum after annealing at ~600° C. for 15 minutes and observation of exciton light emission indicated bipolar transport. At a forward bias of 14 V, a current of 0.1 A was measured, and at 17 V its increase to 0.5 A corresponded to a current density greater than 1500 A/$cm^2$. Compared to conventional p-i-n diodes based on diamond, the introduction of the nanostructured carbon layer enhanced the diamond p-i-n diode and electron emission current by more than an order of magnitude. This was attributed to the reduced contact resistivity of $5.5 \times 10^{-3}$ $\Omega cm^2$ at room temperature. Light emission and diode operation at temperatures greater than 750° C. indicated superior stability of the electrical contact. The n-type diamond layer was characterized by secondary-ion mass spectrometry (SIMS) indicating a phosphorus incorporation of $\sim 2 \times 10^{19}$ $cm^{-3}$ and the nanostructured carbon layer indicated a nitrogen incorporation of $\sim 5 \times 10^{20}$ $cm^{-3}$. Addressing contact limitations to the n-type diamond layer through the growth of moderately p-doped diamond epitaxial layers followed by highly nitrogen doped nano-carbon layers could provide a preferred approach for electronic devices that could also be extended to (100) surfaces.

Diamond p-i-n diodes were prepared using 3 mm×3 mm×0.3 mm HPHT Type Ib plates with (111) surface orientation and a boron concentration of $\sim 1.2 \times 10^{20}$ $cm^{-3}$ indicated by SIMS. These substrates were cleaned by a wet-chemical procedure that commenced with a boil in $H_2SO_4/H_2O_2/H_2O$, 3:1:1 at 220° C. for 15 minutes followed by hydrofluoric acid (HF) treatment for 5 minutes and a final boil in $NH_4OH/H_2O_2/H_2O$, 1:1:5 at 75° C. for 15 minutes. After each step, the substrate was rinsed with deionized (DI) water. The sample was then loaded into a plasma enhanced CVD system with a custom built, water-cooled sample stage and a base pressure of $10^{-8}$ Torr achieved through turbo-pumping backed by a dry roots pump. For the intrinsic diamond layer in the p-i-n structure, process gas flow was established that included 393 standard cubic centimeters per minute (sccm) of hydrogen, 7 sccm of methane and 0.75 sccm of oxygen. At a deposition pressure of ~60 Torr and a microwave power of 1100 W, a growth temperature of 750° C.-850° C. was recorded by a dual-wavelength optical pyrometer. The same instrument allowed in-situ observation of the growth process and derivation of the film thickness using interference oscillations. Devices in this disclosure were prepared with an intrinsic diamond layer of ~5 μm thickness. For the phosphorus doped diamond layer, the intermediate p-i structure was loaded into a similar PECVD system solely used for phosphorus doping. A 200 ppm trimethlyphosphine in hydrogen (TMP/$H_2$) gas mixture was used as phosphorus source. Prior to phosphorus doped diamond deposition, the surface was exposed for 5 minutes to a pure hydrogen plasma where a hydrogen flow rate of 400 sccm, a chamber pressure of 65 Torr and a microwave power of 1500 W resulted in a substrate temperature of ~750° C. as measured by a dual-wavelength optical pyrometer. Adjusting the hydrogen flow rate to 349 sccm and establishing a methane flow rate of 0.25 sccm and a TMP/$H_2$ flow rate of 50 sccm established the growth regime for the phosphorus doped diamond layer, which was maintained for 40 minutes. This resulted in a film thickness of ~400 nm and the p-i-n diode structure that served as a reference for the electrical contact. As disclosed herein, an additional layer was grown on the n-type diamond layer in a similar PECVD system that is used for nitrogen doped diamond growth. This system employs a rotary vane pump as a processing pump and an induction heater utilizing a graphite susceptor. Growth of the contact layer structure commenced after a 5 minute hydrogen plasma cleaning step and utilized a hydrogen flow rate of 400 sccm, a microwave power of 900 W and a chamber pressure of 20 Torr resulting in a temperature of 700° C. The nanostructured carbon (nanoC) contact layer was grown using 5 sccm of hydrogen, 20 sccm of methane, 100 sccm of nitrogen and 10 sccm of argon. With a microwave power of 900 W and a chamber pressure of 20 Torr, the substrate temperature was recorded at ~900° C. and the deposition continued for 20 minutes resulting in a film thickness of 200 nm. For electrical contact characterization of the nanoC layer, a film grown with the same processing parameters was prepared on a (100) Type IIa CVD diamond substrate using the wet-chemical cleaning procedure as described above.

Devices disclosed herein include circular mesa diodes as well as diodes with pronged-fork electrode geometries. Photo-lithography utilizing an aluminum hard mask was employed for etching the mesa in an $O_2/SF_6$ plasma and with a depth from 0.5 µm to 3 µm. Electrical contacts were then deposited through e-beam evaporation using Ti/Pt/Au layers with respective thicknesses of 50 nm/50 nm/150 nm. This processing procedure was compatible with the nanostructured carbon contact layer and its integrity was not adversely affected.

Electrical characterization of the p-i-n diodes for electron emission was performed after a hydrogen passivation of the final device that included exposure of the diamond device die to a pure hydrogen plasma at ~850° C. for 5 minutes. After loading the sample into the electrical characterization chamber, it was evacuated to a base pressure in the mid $10^{-9}$ Torr range. The sample, positioned on a heatable sample stage, was annealed at 600° C. for 15 minutes and after cool-down electrical characterization commenced. Utilizing gold plated probes, individual devices were biased up to 20 V in forward direction using a current-voltage (IV) characterization tool. An electron collector including a gold-plated probe was positioned adjacent to the mesa and a bias varying from 100 V to 500 V was applied using a high voltage power supply. The observation of direct electron emission from a diamond p-n junction suggested its application as an electron source. Electron sources are widely deployed in space and terrestrial telecommunications through travelling wavetubes (TWTs) for radar applications, and scientific apparatus like free electron lasers (FELs), electron microscopes and analytical instruments.

Figure 2B:
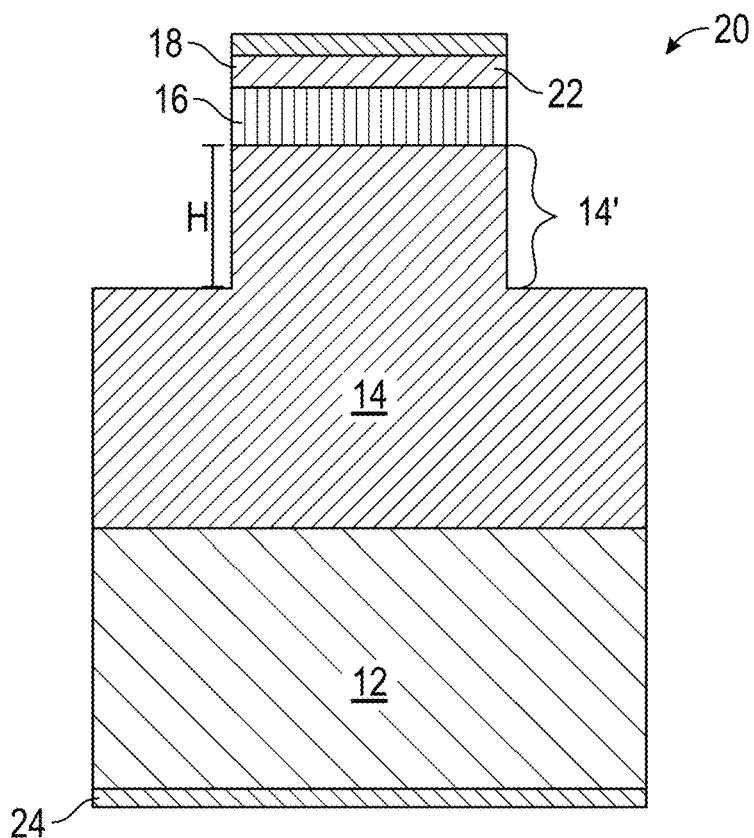
FIG. 2B is a cross-sectional illustration of a p-i-n diode including a nanostructured carbon layer arranged between a metal contact and an n-type diamond layer according to embodiments disclosed herein.

Diamond has long been investigated for electron emission applications due to the ability of its surfaces to obtain negative electron affinity characteristics, which shift the vacuum level below the conduction band minimum (CBM) thus enabling direct release of electrons from the CBM into vacuum. Injecting electrons into the conduction band of a diamond p-i-n diode presents an approach that allows a fraction of the diode current to be emitted into vacuum. The corresponding devices, shown schematically in FIGS. 2A and 2B, present a lithographically processed mesa of a layered diamond structure in a p-i-n configuration. In particular, FIG. 2A is a cross-sectional illustration of a diamond p-i-n diode 10 that includes a p-type diamond layer 12, an intrinsic diamond layer 14, an n-type diamond layer 16, and a metal contact layer 18. FIG. 2B is a cross-sectional illustration of a diamond p-i-n diode 20 that is similar to the diamond p-i-n diode 10 of FIG. 2A and further includes a nanostructured carbon (nanoC) layer 22 that is arranged between the metal contact layer 18 and the n-type diamond layer 16 according to embodiments disclosed herein.

In FIG. 2A, a highly boron doped substrate (e.g., $[B] \approx 1.2 \times 10^{20}$ cm$^{-3}$) was used with a thickness of 300 µm for the p-type diamond layer 12, and a surface of the p-type layer 12 was oriented along the (111) direction. The intrinsic diamond layer 14 with a thickness of 5 µm was grown by PECVD on the p-type diamond layer 12 and the successive phosphorus doped, n-type diamond layer 16 was grown on the intrinsic diamond layer 14 with a thickness of about 0.4 µm to cap the diamond p-i-n diode 10. In certain embodiments, the n-type diamond layer 16 may comprise a thickness in a range from about 0.4 µm to about 300 µm. In certain embodiments, the n-type diamond layer 16 comprises a doping concentration in a range from about $2 \times 10^{19}$ cm$^{-3}$ to about $5 \times 10^{20}$ cm$^{-3}$, or in a range from about $1 \times 10^{17}$ cm$^{-3}$ to about $5 \times 10^{20}$ cm$^{-3}$. In further embodiments, the n-type diamond layer 16 may comprise a doping concentration as low as $1 \times 10^{16}$ cm$^{-3}$ and may accordingly be referred to as an intrinsic diamond layer. A mesa 14' is formed in the intrinsic diamond layer 14 with a height H in a range from about 0.5 µm to about 3 µm. Circular mesa diodes with mesa diameters of 50 µm, 100 µm and 200 µm were prepared using Ti/Pt/Au top contact structures for the metal contact layer 18. The same Ti/Pt/Au metallurgy was used to form a bottom contact 24 on the backside of the device, i.e. the boron doped substrate or p-type diamond layer 12. The final diamond p-i-n diode 10 was exposed to a hydrogen plasma at 850° C. for 5 minutes in order to induce negative electron affinity characteristics of the diamond surface. An electron characterization system with a base pressure less than $5 \times 10^{-9}$ Torr was used to characterize the current-voltage and emission properties of the diamond p-i-n diode 10. The system is equipped with an ultra-high vacuum (UHV) compatible heatable sample stage and a pyrometer to monitor the sample temperature. Prior to electrical device characterization, the sample was annealed (in the measurement system) at 650° C. for 15 minutes to remove adsorbates.

For comparison, the diamond p-i-n diode 20 of FIG. 2B was prepared by PECVD under the same growth parameters for the epitaxial diamond layers with the same thicknesses and doping concentrations as the diamond p-i-n diode 10 of FIG. 2A. In addition, a carbon layer such as the nanoC layer 22 with high nitrogen incorporation (e.g., $\sim 3 \times 10^{20}$ cm$^{-3}$) was grown with a thickness of about 200 nm on top of the phosphorus doped n-type diamond layer 16, as further illustrated in FIG. 2B. The metal contact layer 18 and the bottom contact 24 were formed with the same Ti/Pt/Au metallurgy as the diamond p-i-n diode 10 of FIG. 2A. In addition to Ti/Pt/Au metals, the metal contact layer 18 and the bottom contact 24 may also include other metals, including but not limited to molybdenum, tungsten, rhenium, and alloys thereof with varying compositions. In certain embodiments, the metal contact layer 18 comprises a molybdenum-rhenium alloy and in further embodiments, the molybdenum-rhenium alloy may comprise a rhenium composition of about 47.5%. Hydrogen passivation of the final device was performed in a pure hydrogen plasma with the sample at 850° C. for 5 minutes. The integrity of the nanoC layer 22 in the diamond p-i-n diode 20 was maintained during this process. Device characterization commenced after an annealing step at 650° C. for 15 minutes. In this manner, a contact structure for the p-i-n diode 20 is formed by the metal contact layer 18 and the nanoC layer 22. In certain embodiments, the nanoC layer 22 may be on a surface of the n-type diamond layer 16 that either comprises a (100) crystallographic plane or is off-axis from such plane by no more than 20 degrees. In other embodiments, the nanoC layer 22 may be on a surface of the n-type diamond layer 16 that either comprises a (111) crystallographic plane or is off-axis from such plane by no more than 20 degrees. In still other embodiments, the nanoC layer 22 may be on a surface of the n-type diamond layer 16 that either comprises a (110) crystallographic plane or is off-axis from such plane by no more than 20 degrees.

The diamond p-i-n diodes 10 and 20 were operated through application of a variable forward bias $U_{diode}$ across the devices and contacted through gold-plated probes. Simultaneously, an electrode was positioned about 100 μm above the diamond p-i-n diodes 10 and 20 and biased at $U_{bias}$=100 V to collect electrons from a single diode. A current $I_{diode}$ through the diamond p-i-n diodes 10 and 20 was varied and an electron emission current $I_{em}$ recorded with the bias voltage as a parameter.

Figure 3A:
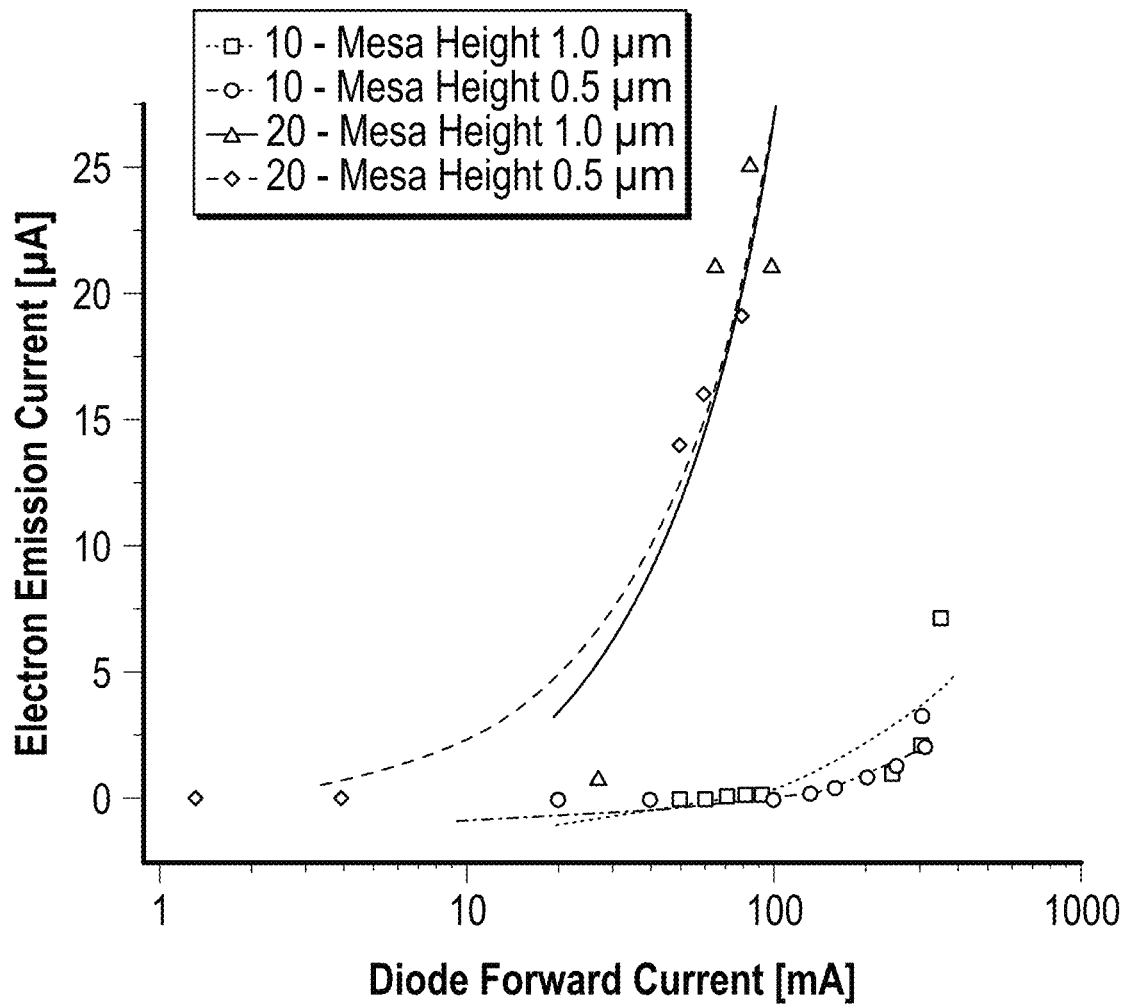
FIG. 3A is a comparison plot for electron emission current versus diode forward current for various diodes corresponding to FIGS. 2A and 2B.

FIG. 3A is a comparison plot for electron emission current versus diode forward current for various diodes corresponding to the diamond p-i-n diode 10 of FIG. 2A and the diamond p-i-n diode 20 of FIG. 2B. In FIG. 3A, the curve from data points with circle labels represents data from diodes according to the diamond p-i-n 10 of FIG. 2A with a 200 μm diameter and a mesa height of 0.5 μm. The curve from data points with square labels represents data from diodes according to the diamond p-i-n 10 of FIG. 2A with a 200 μm diameter and a mesa height of 1 μm. Under a diode forward bias of $U_{bias}$=20 V, the diode current was increased up to 400 mA with the electron emission current exceeding 7 μA. For the devices according to the diamond p-i-n diode 20 that include a contact structure with the nanoC layer 22 of FIG. 2B, the same characterization was performed. In FIG. 3A, the curve from data points with triangle labels represents data from diodes according to the diamond p-i-n diode 20 of FIG. 2B with a 200 μm diameter and a mesa height of 1.0 μm. The curve from data points with diamond labels represents data from diodes according to the diamond p-i-n diode 20 of FIG. 2B with a 200 μm diameter and a mesa height of 0.5 μm. As illustrated, the presence of the nanoC layer 22 of FIG. 2B indicates a significant enhancement in the emission current and a reduced operating voltage of $U_{diode}$=16 V. In particular, a 200 μm diameter diamond p-i-n diode 20 with a mesa height of 1 μm was biased in forward direction, and at a diode current of 65 mA an electron emission current of 21 μA was measured.

Light emission from the diodes 10, 20 is typically observed in the UV and visible range. Deep-UV emission peaking around 240 nm was attributed to free-exciton recombination coupled with transverse-optical phonons ($FE_{TO}$). Broadband emission from deep levels with peaks around 350 nm and 500 nm was related to defects and nitrogen states. The observation of light emission from the diamond p-i-n diode 20 was attributed to free exciton recombination that was shown to occur at ~235 nm (5.27 eV) near the band edge. The generation and propagation of free excitons, in part defined by defects in the bulk and in the surface, can contribute to the electron emission by partially diffusing to the surface. For mesa structures with 0.5 μm and 1 μm height, no significant change in the emission current was detected for the diamond p-i-n diodes 20.

Figure 3B:
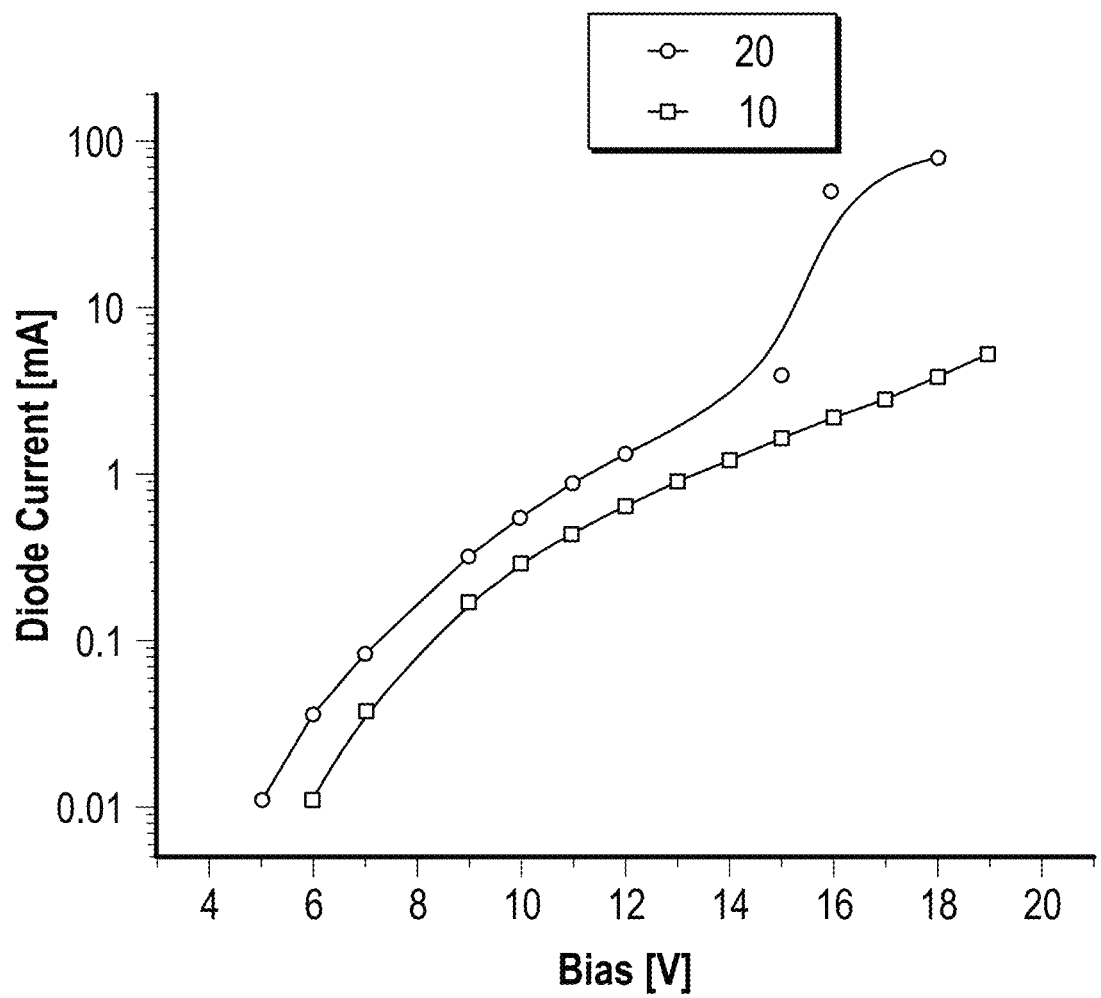
FIG. 3B is a comparison plot for diode current versus bias voltage for diodes corresponding to FIG. 2A and FIG. 2B.

Another significant observation in the performance of the diamond p-i-n diode 20 was the increased diode current at a reduced forward bias as shown in FIG. 3B. FIG. 3B is a comparison plot for diode current versus bias voltage for diodes corresponding to FIG. 2A (data points and curve labeled "10") and FIG. 2B (data points and curve labeled "20"). As illustrated, the diamond p-i-n diodes 20 corresponding to FIG. 2B demonstrated increased current compared with the diamond p-i-n diodes 10 of FIG. 2A. The corresponding efficiency was calculated to 2.0×10$^{-5}$ A/W. In a report by Takeuchi et al. titled "Electron Emission from a Diamond (111) p-i-n+ Junction Diode with Negative Electron Affinity during Room Temperature Operation," Applied Physics Express 3, no. 4 (2010): 041301, a diamond p-i-n+ diode with a phosphorus concentration of 10$^{20}$ cm$^{-3}$ was characterized at a forward voltage of 81 V establishing a diode current of 5 mA and resulting in an emission current of 8.8 μA. Similarly, the efficiency can be calculated as 2.1×10$^{-5}$ A/W. It should be noted that results from Takeuchi et al. targeted a higher emission efficiency for an "inverted" p-i-n+ diode where a Type Ib (111) oriented substrate was used for growth of a heavy phosphorus doped n+ layer, intrinsic layer, and a top p-type layer with a boron concentration <10$^{18}$ cm$^{-3}$. The agreement in the comparison of efficiencies for devices prepared with the nanoC layer 22 of FIG. 2B and an n+ layer identifies the importance of the n-type electrical contact for the emission diodes and verifies the viability of the nanoC layer 22 contact approach.

Figure 4:
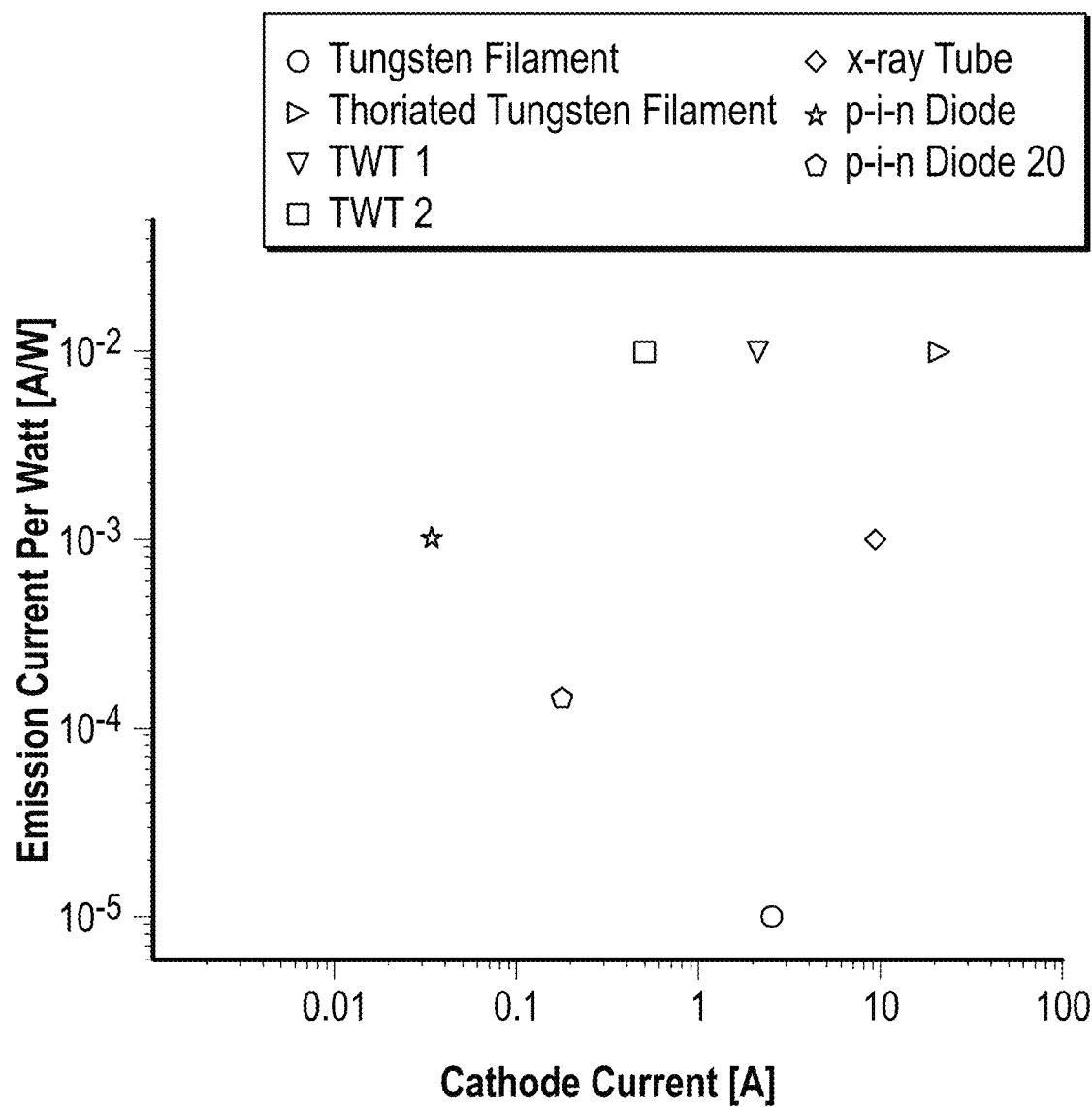
FIG. 4 is a comparison plot for emission current per watt versus cathode current for various electron sources.

To establish a measure of efficiency for p-i-n diode based electron sources, a comparison of the diamond p-i-n diode 20 of FIG. 2B with currently used devices that utilize a cathode (thermionic), such as x-ray sources, TWTs, and microwave magnetrons, is presented in FIG. 4. One of the most basic electron sources can be realized by a tungsten filament. Through direct heating, power is dissipated in the wire and an electron current is released through thermionic electron emission. A typical tungsten filament device (e.g., HeatWave Labs, Inc., tungsten filament source HWE 5105262) can be characterized by an efficiency of ~10$^{-5}$ A/W, i.e., electron emission current/electrical power dissipated in the cathode. For a practical apparatus (e.g., TOSHIBA Industrial Magnetron 2M164, 1.3-1.6 kW, 2.45 GHz), an efficiency for the directly heated thoriated tungsten filament of ~10$^{-2}$ A/W can be derived. Similarly, for typical travelling wavetubes (TWT) to the mm spectrum (e.g., Teledyne Microwave Solutions, Continuous Wave TWT MEC 5500E, 400 W, 2-6.5 GHz; L3 Electron Devices, Mini-Traveling Wave Tube L6122, 50 W, 30-36 GHz), the electron source efficiency is ~10$^{-2}$ A/W. A somewhat lower efficiency was derived for an industrial x-ray tube source (e.g., Varex Imaging Corporation, Industrial X-Ray Tube OEG-83J) utilizing a toroidal, tungsten based electron source with an efficiency of ~10$^{-3}$ A/W. It should be noted that for devices where the anode current $I_a$ was specified, it was assumed $I_a$=(1−α) $I_c$, with $I_c$ the emission current from the cathode and α typically in the range 0.65-0.75. A high voltage vacuum switch has been previously demonstrated utilizing a p-i-n diode with an intrinsic diamond layer thickness of 40 μm, a 350 μm thick p-type layer with a boron doping concentration of 3×10$^{17}$ cm$^{-3}$ and a 200 nm thick n-type layer with a phosphorus doping concentration of 1×10$^{20}$ cm$^{-3}$ as described by Takeuchi et al. for "4 A/cm 2, 7 kV normally-off diamond-emitter vacuum switch," in 2015 IEEE 27th International Symposium on Power Semiconductor Devices & IC's (ISPSD), pp. 197-200. IEEE, 2015. Under a forward bias of 25 V, a diode current of 35 mA was established and an emission current of 0.91 mA presented an efficiency of 1×10$^{-3}$ A/W. For comparison, data is represented for the diamond p-i-n diode 20 of FIG. 2B under a forward bias of 9V.

Figure 5A:
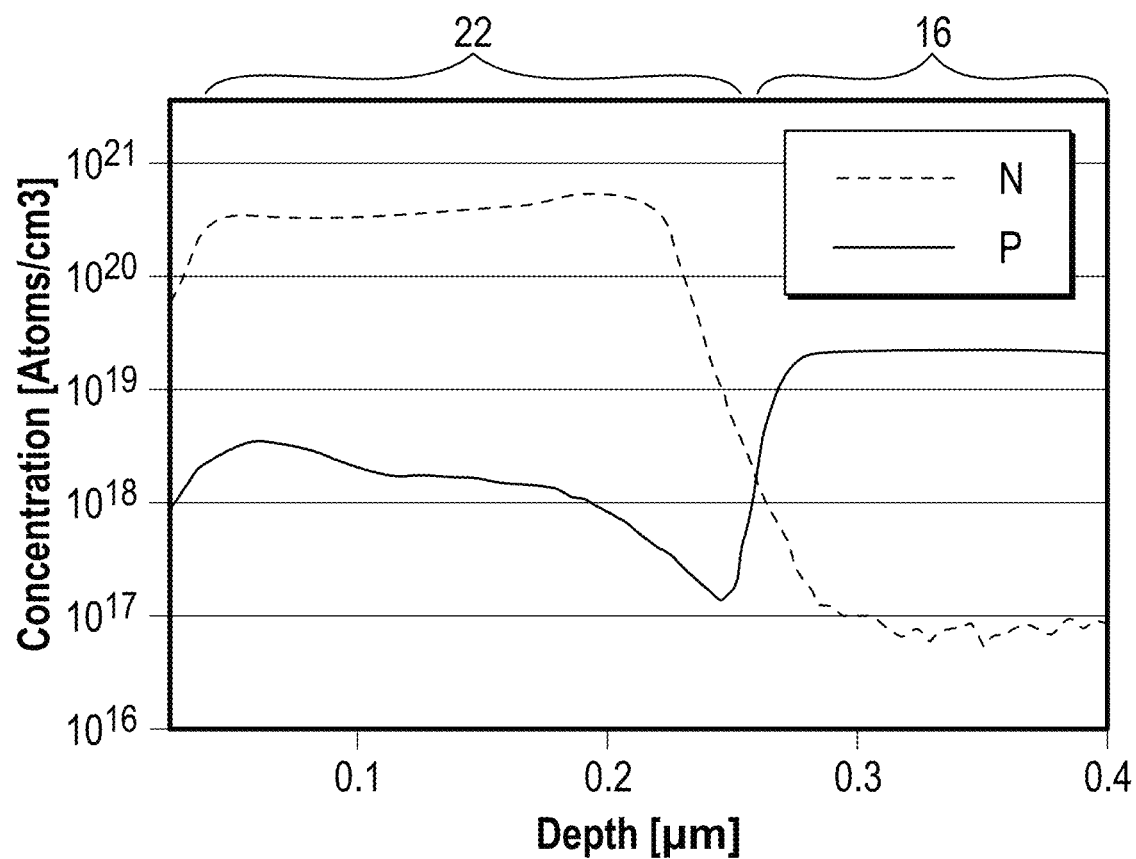
FIG. 5A is a secondary-ion mass spectrometry (SIMS) characterization of the p-i-n-nanoC diode of FIG. 2B.

SIMS characterization of the top section of the diamond p-i-n diode 20 of FIG. 2B communicated a heavy nitrogen doped nanoC layer 22 in the amount of [N]>3×10$^{20}$ cm$^{-3}$ and a moderate phosphorus incorporation in the amount of [P] of 2×10$^{19}$ cm$^{-3}$ for the n-type diamond layer 16 as shown in FIG. 5A. In conjunction with the electrical characterization data of the diamond p-i-n diode 20 of FIG. 2B and p-i-n+ diodes, the results further indicate that the highly nitrogen doped nanoC layer 22 of FIG. 2B can mitigate the high contact resistance due to a reduced doping concentration of the n-type diamond layer 16.

Figure 5B:
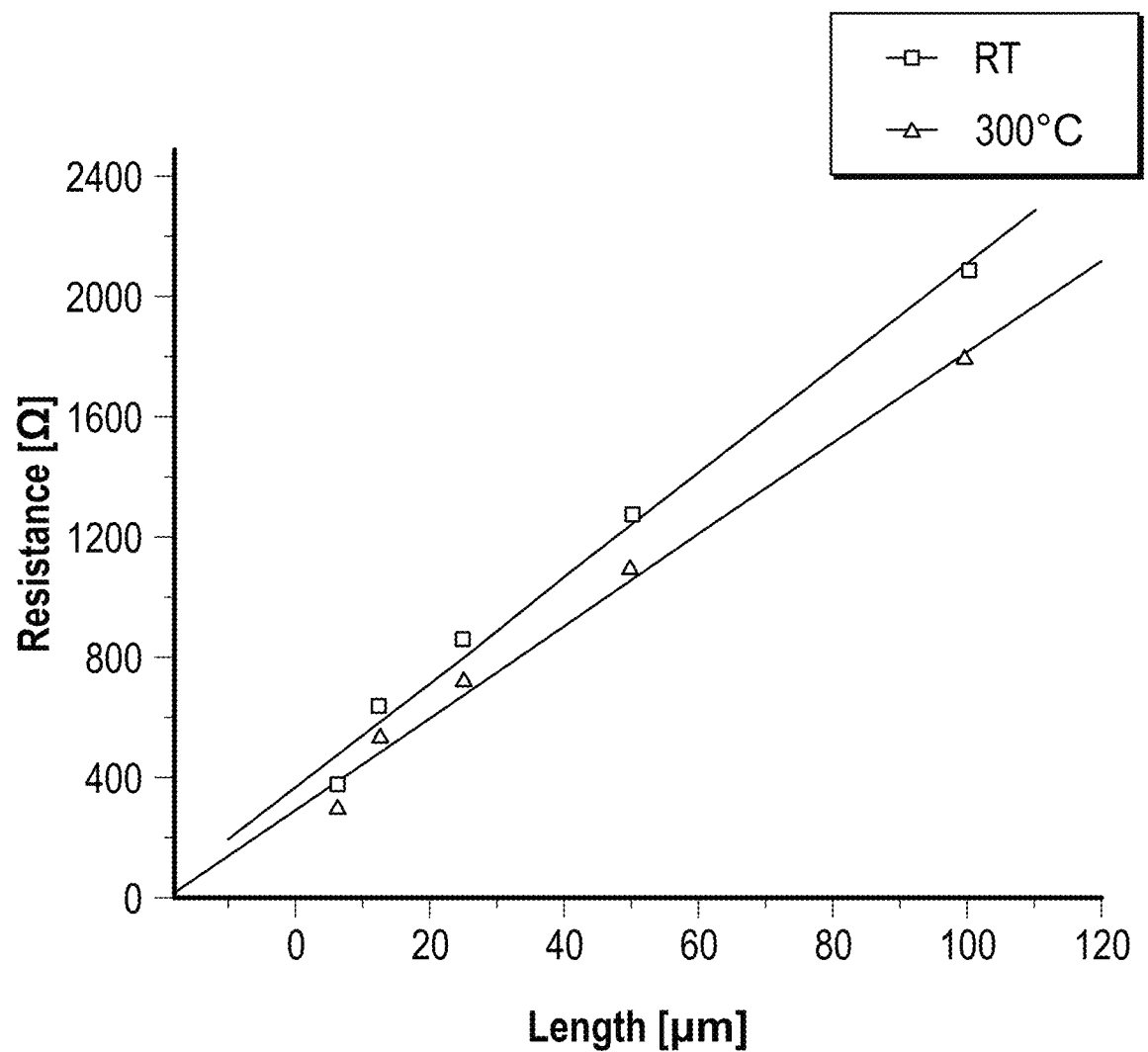
FIG. 5B is a comparison plot for a transfer length method (TLM) characterization of contact resistance versus length for nanostructured carbon contact structures at room temperature and at 300° C.
Figure 5C:
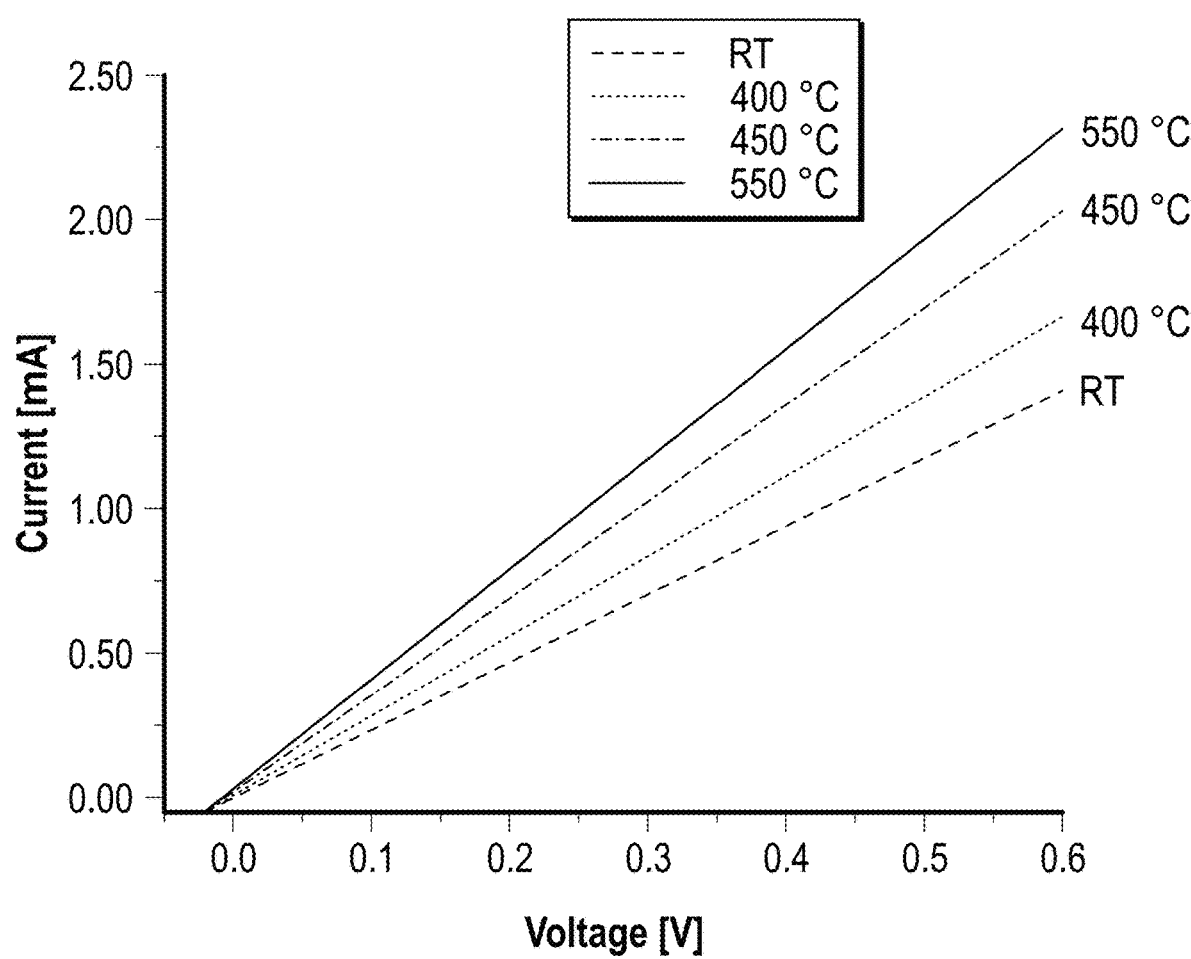
FIG. 5C is a current-voltage (I/V) plot for contact structures that include a metal contact layer on a nanostructured carbon contact layer according to embodiments disclosed herein.

For a quantitative electrical contact analysis, an identical nanoC layer 22 was deposited on a Type IIa CVD diamond substrate with (100) surface orientation and a transfer length method (TLM) pattern was prepared using Ti/Pt/Au metallurgy. Electrical characterization was performed after the same annealing step used for the diamond p-i-n diodes 20 and in the same UHV characterization system. FIG. 5B displays electrical measurements acquired at room temperature (RT) and at 300° C. At room temperature (e.g., 25° C.), the Ti/Pt/Au contacts to the nanoC layer 22 were characterized with a contact resistance of 185Ω and a specific contact resistance of $5.5 \times 10^{-3}$ Ωcm². With an increase in temperature to 300° C., the contact resistance decreased to 147Ω and the specific contact resistance decreased to $4.2 \times 10^{-3}$ Ωcm² indicating n-type behavior of the nanoC layer 22. In this regard, the contact structure of the metal contact layer 18 and the nanoC layer 22 may comprise an electrical contact resistivity in a range from about $4 \times 10^{-3}$ Ωcm² to about $5 \times 10^{-3}$ Ωcm² at a temperature of about 300° C. In certain embodiments, the contact structure of the metal contact layer 18 may comprise an electrical contact resistivity in a range from about $1 \times 10^{-3}$ Ωcm² to about $6 \times 10^{-3}$ Ωcm² at a temperature of about 300° C. or at room temperature. Ohmic contact formation of various metals to nitrogen incorporated nanocrystalline diamond (NCD) and ultra-nanocrystalline diamond (UNCD) was previously demonstrated with a low contact resistivity of $200\text{-}380 \times 10^{-3}$ Ωcm² reported for nickel contacting nitrogen doped NCD. FIG. 5C is a current-voltage (I/V) plot for contact structures that include the metal contact layer 18 on the nanoC layer 22 according to embodiments disclosed herein. As illustrated, the contact structures are stable at temperatures ranging from room temperature (RT) up to 550° C.

Figure 6A:
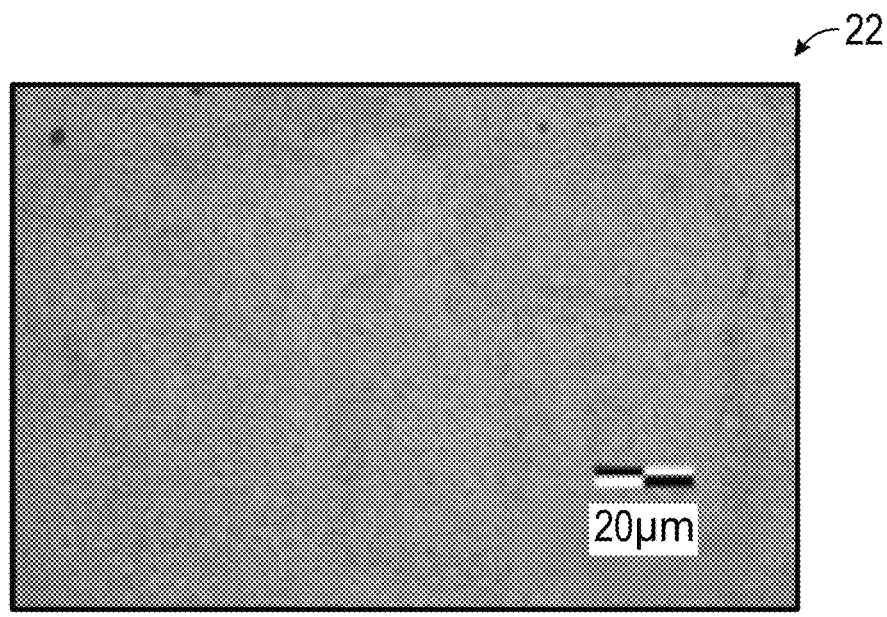
FIG. 6A is an optical microscopic image of a nanostructured carbon film grown on a (111) p-i-n diode structure.

Electrical properties of nanostructured diamond in the form of NCD and UNCD diamond have been widely discussed in the literature where nitrogen incorporation was typically employed to control electrical conductivity. As nitrogen is preferentially incorporated into the graphitic grain boundaries, a growth regime is provided in a nitrogen rich ambient and under the addition of significant methane flow that was expected to increase the graphitic grain boundary phase in the film and saturate its nitrogen content. Growth of the nanostructured carbon film (e.g., the nanoC layer 22) using the parameters presented herein resulted in a nitrogen incorporation with ranges up to $\sim 5 \times 10^{20}$ cm$^{-3}$ which exceeds previously reported results of $\sim 2 \times 10^{20}$ cm$^{-3}$ for nitrogen incorporated UNCD films. Under the addition of argon, a shift in the film morphology to a nanostructured nature was observed and attributed to an increase in the $C_2$ dimer concentration in the reactant gas phase. Thus, control of the diamond grain size in the film can be achieved through the argon related enhancement of secondary or re-nucleation processes. An optical microscopy image of film that is provided according to the nanoC layer 22 of FIG. 2B, before device fabrication, is depicted in FIG. 6A. The nanoC layer 22 surface exhibits a uniformly structured morphology with an average grain size of ~500 nm. In certain embodiments, the average grain size is in a range from 300 nm to 500 nm, or in a range from about 30 nm to about 1000 nm, or in a range from about 30 nm to about 200 nm, or in a range from about 10 nm to about 1000 nm, or in a range from about 10 nm to about 200 nm, or in a range from about 500 nm to about 1000 nm. This increased grain size is contrasted by dimensions typically observed in nanocrystalline and ultrananocrystalline diamond films and can be attributed to growth in a nitrogen rich ambient. Larger scale variations observed in the surface can be attributed to features originating from growth of the intrinsic and n-type diamond layers 14, 16 on the (111) oriented p-type substrate. The nanoC layer 22 of FIG. 6A was grown with deposition conditions of ~900° C. growth temperature, 900 W microwave power, 20 Torr chamber pressure, 5 sccm of hydrogen, 20 sccm of methane, 100 sccm of nitrogen, and 10 sccm of argon.

Figure 6B:
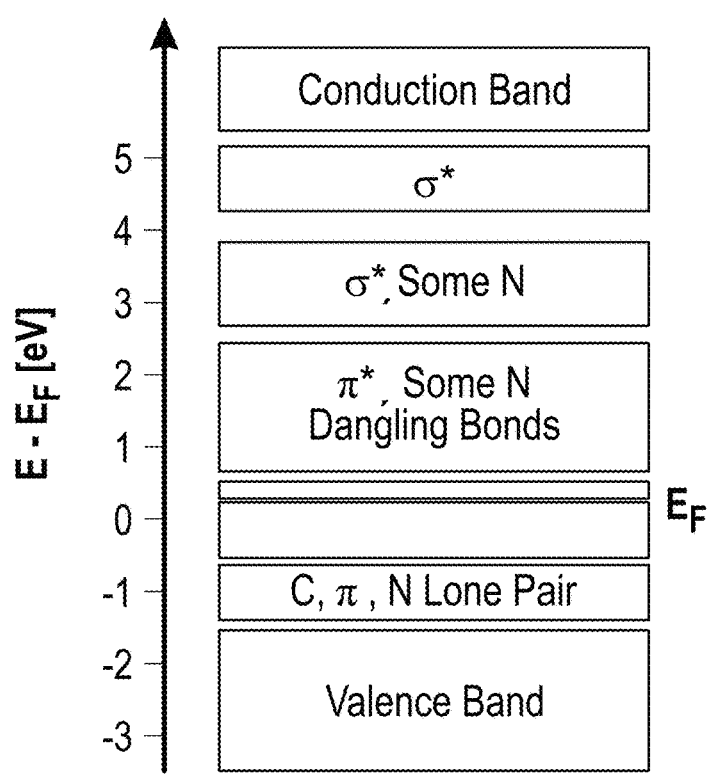
FIG. 6B represents the electronic structure of ultrananocrystalline diamond grain boundaries with nitrogen incorporation.

As illustrated in FIG. 6B, the electronic structure of grain boundaries in UNCD films under nitrogen addition was modeled by Zapol et al. in the paper "Tight-binding molecular-dynamics simulation of impurities in ultrananocrystalline diamond grain boundaries," Physical Review B 65, no. 4 (2001): 045403, in a Tight-binding molecular-dynamics simulation. The results indicated the formation of mid-gap states near and ~3 eV above the Fermi level in $\pi^*$ and $\sigma^*$ carbon bond configurations, respectively. The states were projected to tail into the conduction band due to distortions in bond geometries. It was further suggested that electrons from carbon dangling bonds, hybridized with nitrogen lone pairs, can transfer to carbon defects near the Fermi level resulting in its upward shift toward the $\pi^*$ band. With an increase in nitrogen, the $sp^2$ bonded carbon phase is increased resulting in a broadening of the $\pi$ and $\pi^*$ states and an increase of their delocalization effects quasimetallic properties. Electronic transport in the grain boundaries can then be described in terms of conduction band conductivity σc and hopping conductivity σh that requires localized states at the Fermi level. Formation of ohmic contacts is then defined by the mid gap states in the grain boundaries which was demonstrated through etching of the $sp^2$ carbon phase and deterioration in the ohmic contact behavior.

Figure 7A:
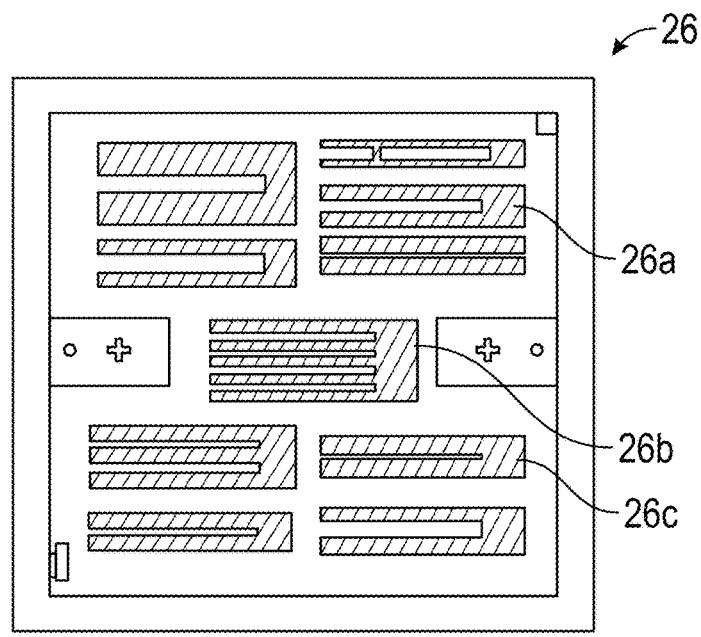
FIG. 7A is a top view image of a 3 mm×3 mm diamond die with various individual operating unit arrangements.
Figure 7B:
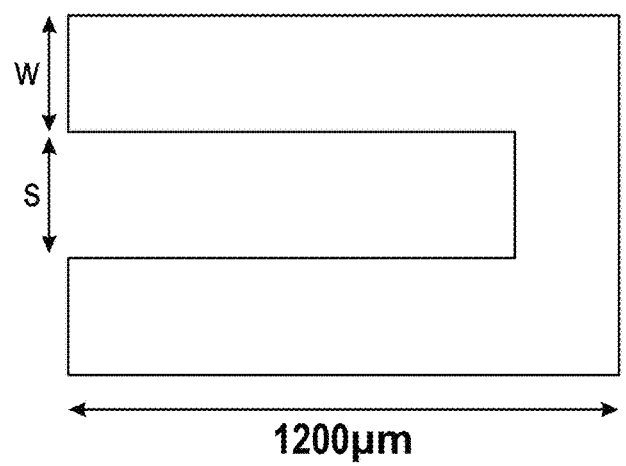
FIG. 7B illustrates dimensions of three diode arrangements of FIG. 7A with varying trace widths (w) and separation/spacing (s) arrangements.
Figure 7C:
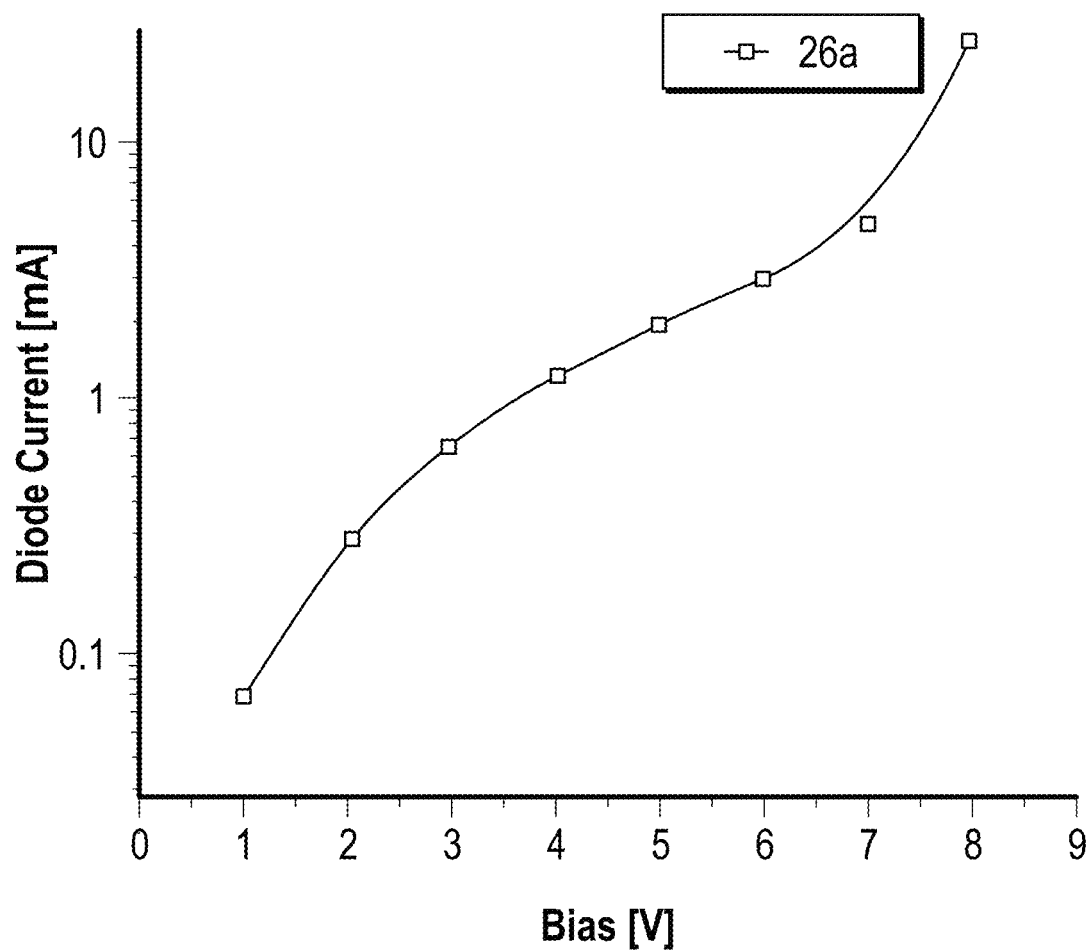
FIG. 7C is an I/V plot of the diode of FIG. 7A.

To establish emission efficiency defining parameters, diamond p-i-n-nanoC emission diodes according to the diamond p-i-n diodes 20 of FIG. 2B were prepared with varying fork-like electrode geometries as shown in FIG. 7A. Additionally, the thickness of the nanoC layer 22 of FIG. 2B was reduced by adjusting the deposition time from 20 minutes to 15 minutes, which was expected to reduce the nanoC layer 22 thickness from 200 nm to 150 nm. The linear components were fabricated with a trace width w of 50 μm and 100 μm and with the mesa 14' etched 3 μm into the intrinsic diamond layer 14 of FIG. 2B. A 3 mm×3 mm diamond die 26 according to the p-i-n diode 20 of FIG. 2B is shown in FIG. 7A, and individual operating units or diodes 26a, 26b and 26c are distinguished by their respective light emission. FIG. 7B illustrates dimensions of the three diodes 26a, 26b and 26c of FIG. 7A with varying trace widths (w) and separation/spacing (s) arrangements of 50 μm and 100 μm. The dimensions of the diodes 26a, 26b, and 26c are included in the table of FIG. 7B. FIG. 7C is an I/V plot of the diode 26a in FIG. 7A and indicates a current of 25 mA at a bias of 8 V and at a bias of 9 V the diode was operated under current compliance. Notably, a significant observation in diode performance is indicated through the significantly reduced operating voltage of 9 V.

Figure 8A:
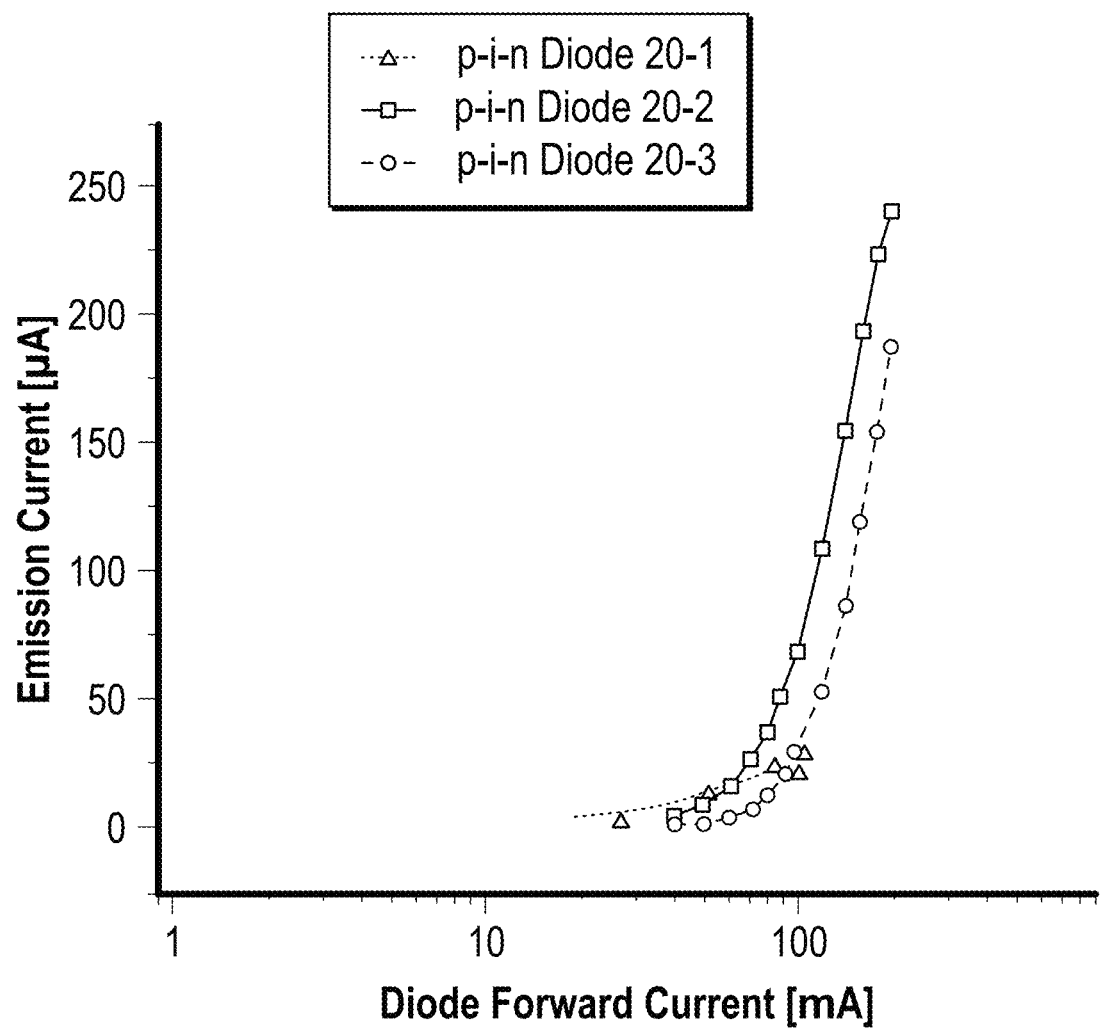
FIG. 8A is a comparison plot of emission current versus diode forward current for various electrode configurations of the p-i-n-nanoC diode.
Figure 8B:
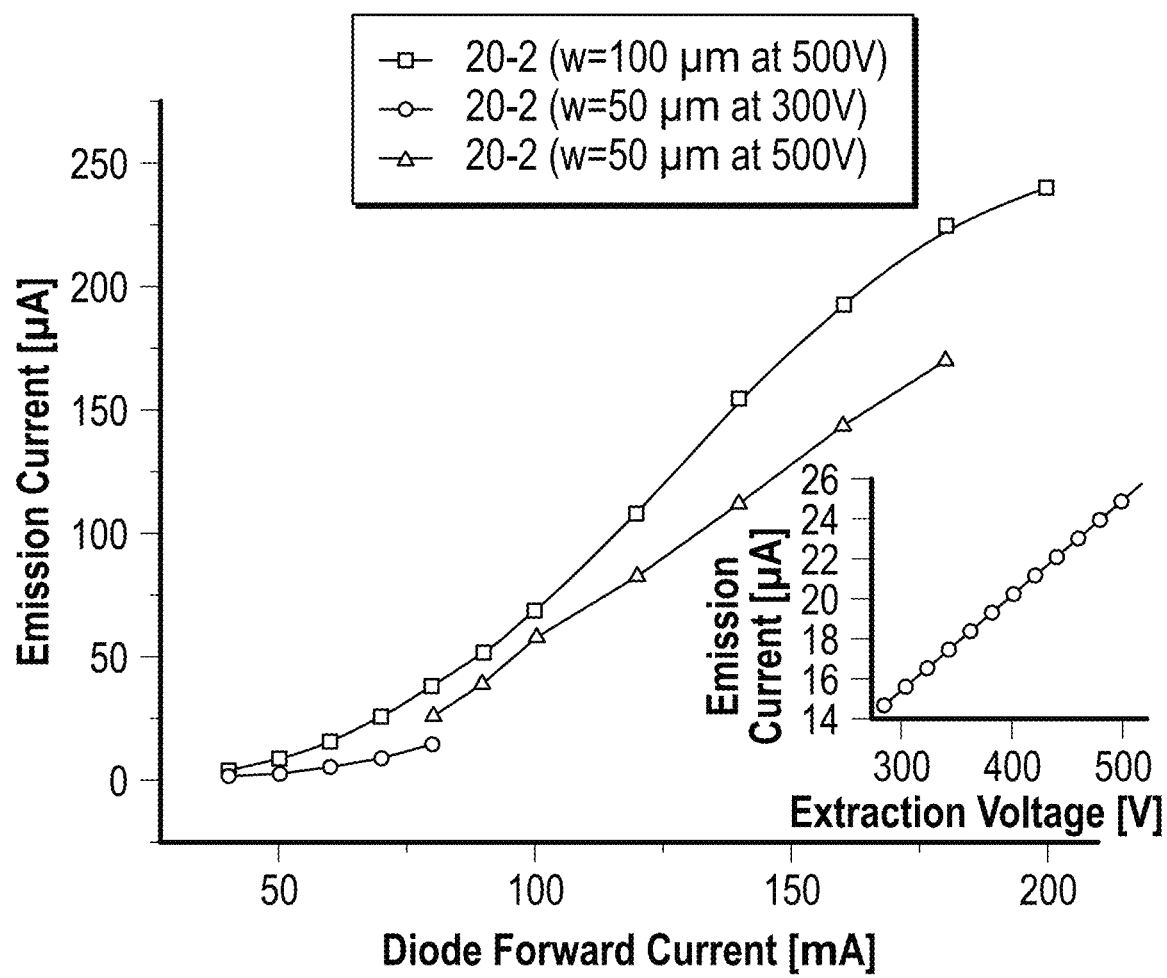
FIG. 8B is a comparison plot of emission current versus diode forward current for 2 finger electrode structures with varying widths.

For the linear structures, the same hydrogen passivation and annealing procedures were employed prior to electrical characterization with data plotted in FIGS. 8A and 8B. FIG. 8A is a comparison plot of emission current versus diode forward current of the diamond p-i-n diode 20 of FIG. 2B with various configurations (represented as 20-1 to 20-3). In FIG. 8A, electron emission current for a diamond p-i-n diode 20-1 with circular geometry and a mesa height of 1.0 µm is indicated by the data points and curve with triangle labels. Electron emission current for a diamond p-i-n diode 20-2 with linear geometry with 2 electrode or contact fingers is indicated by the data points and curve with square labels, and for a diamond p-i-n diode 20-3 with 5 electrode fingers is indicated by the data points and curve with circle labels. The mesa height for the diamond p-i-n diodes 20-2 and 20-3 is configured at 3.0 µm. As illustrated, the 2 electrode finger diode 20-2 displays enhanced electron emission current. For the p-i-n diode 20-2 that is configured similar to the device 26c in FIG. 7A (e.g., 2 electrode fingers), a forward current of 200 mA at 9 V bias resulted in an electron emission current of 240 µA, as illustrated in FIG. 8A. This improvement in electrical diode characteristics including an increased forward current at a reduced bias, is observed for all devices 26a, 26b, and 26c in FIG. 7A indicating the high degree of uniformity in the diamond epitaxy and lateral uniformity of the nanoC layer 22. It furthermore signifies the effects of an optimized nanoC layer 22, in the contact structure, where its resistivity reduction through film thickness can contribute to the increased diode current. With the reduced diode operating voltage of 9 V and at a corresponding diode current of 200 mA, an emission current of 240 µA corresponds to an efficiency of ~$1.3 \times 10^{-4}$ A/W which is about an order of magnitude higher than emission from the circular device. FIG. 8B is a comparison plot of emission current versus diode forward current of the diamond p-i-n diode 20-2 of FIG. 8A with 2 electrode finger structures with varying widths. As the extraction voltage is increased, the electron emission current increases with linear dependence as shown in the insert in FIG. 8B. A closer investigation of the electron emission for the diamond p-i-n diode 20-2 with a trace width w of 50 µm and 100 µm indicates an improved emission current for the device with 100 µm wide traces. This observation signifies advantageous effects of emitter geometry and its dimensions for improved efficiencies.

Diamond solid state electronics rely on practical contacts to p-type and n-type diamond where low specific contact resistances are required in particular for high power and high frequency devices. While suitable ohmic contacts to p-type diamond are readily prepared due to the ability to grow highly boron doped material, similar contact developments to n-type diamond still present a challenge. PECVD growth of phosphorus doped, n-type diamond has emerged as the preferred method for diamond electronics; however, high phosphorus incorporation, in particular on (100) oriented surfaces, is not readily and reliably attained. As a result, electrical contacts to n-type diamond are similarly problematic. As disclosed herein, a contact approach to phosphorus doped, n-type diamond is improved by arranging a high nitrogen incorporated nanostructured carbon (nanoC) layer between a metal contact and the n-type diamond. With a nitrogen concentration as high as ~$5 \times 10^{20}$ cm$^{-3}$, this nanoC layer can mitigate reduced phosphorus incorporation of the n-type layer and along with a Ti/Pt/Au contact metallurgy, provide a low specific contact resistance of $5.5 \times 10^{-3}$ Ωcm$^2$ at room temperature. This low value was in part attributed to the electronic structure in the nanoC grain boundaries that can affect quasimetallic materials characteristics. Application of this nanoC contact approach in a diamond p-i-n-nanoC diode for electron emission demonstrated its viability for devices exceeding conventional approaches presented for p-i-n+ diode with a phosphorus concentration of ~$10^{20}$ cm$^{-3}$.

In certain embodiments, any of the foregoing aspects, and/or various separate aspects and features as described herein, may be combined for additional advantage. Any of the various features and elements as disclosed herein may be combined with one or more other disclosed features and elements unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. An electronic device comprising:
   a n-type diamond layer;
   a nanostructured carbon layer that is doped with nitrogen, the nanostructured carbon layer comprising an average grain size in a range from 10 nm to 1000 nm and a plurality of grain boundaries that are incorporated with the nitrogen, wherein the nanostructured carbon layer is on the n-type diamond layer; and
   a metal contact layer on the nanostructured carbon layer, wherein the metal contact layer and the nanostructured carbon layer form a contact structure in conductive electrical communication with the n-type diamond layer.

2. The device of claim 1, wherein the nanostructured carbon layer comprises n-type conductivity.

3. The device of claim 1, wherein a nitrogen concentration of the nanostructured carbon layer is in a range from about $4.5 \times 10^{20}$ cm$^{-3}$ to about $5.5 \times 10^{20}$ cm$^{-3}$.

4. The device of claim 1, wherein a nitrogen concentration of the nanostructured carbon layer is in a range from about $1 \times 10^{19}$ cm$^{-3}$ to about $5.5 \times 10^{20}$ cm$^{-3}$.

5. The device of claim 1, wherein the nanostructured carbon layer comprises an average grain size in a range from about 300 nm to about 500 nm.

6. The device of claim 1, wherein the nanostructured carbon layer comprises an average grain size in a range from about 10 nm to about 200 nm.

7. The device of claim 1, wherein the nanostructured carbon layer comprises an average grain size in a range from about 500 nm to about 1000 nm.

8. The device of claim 1, wherein the n-type diamond layer comprises an n-type doping concentration in a range from about $2 \times 10^{19}$ cm$^{-3}$ to about $5 \times 10^{20}$ cm$^{-3}$.

9. The device of claim 1, wherein the n-type diamond layer comprises an n-type doping concentration in a range from about $1 \times 10^{17}$ cm$^{-3}$ to about $5 \times 10^{20}$ cm$^{-3}$.

10. The device of claim 1, wherein the n-type diamond layer is doped with phosphorus.

11. The device of claim 1, wherein the contact structure comprises an electrical contact resistivity in a range from about $1 \times 10^{-3}$ Ωcm$^2$ to about $6 \times 10^{-3}$ Ωcm$^2$ at room temperature.

12. The device of claim 1, wherein the contact structure comprises an electrical contact resistivity in a range from about $1 \times 10^{-3}$ Ωcm$^2$ to about $6 \times 10^{-3}$ Ωcm$^2$ at a temperature of about 300° C.

13. The device of claim 1, wherein the nanostructured carbon layer is on a surface of the n-type diamond layer that either comprises a (100) crystallographic plane or is off-axis from the (100) crystallographic plane by no more than 20 degrees.

14. The device of claim 1, wherein the nanostructured carbon layer is on a surface of the n-type diamond layer that either comprises a (111) crystallographic plane or is off-axis from the (111) crystallographic plane by no more than 20 degrees.

15. The device of claim 1, wherein the nanostructured carbon layer is on a surface of the n-type diamond layer that either comprises a (110) crystallographic plane or is off-axis from the (110) crystallographic plane by no more than 20 degrees.

16. The device of claim 1, further comprising:
a p-type diamond layer; and
an intrinsic diamond layer that is arranged between the p-type diamond layer and the n-type diamond layer to form a p-i-n diode structure.

17. The device of claim 1, wherein the metal contact layer comprises at least one of titanium, platinum, gold, or alloys thereof.

18. The device of claim 1, wherein the metal contact layer comprises at least one of molybdenum, tungsten, rhenium, or alloys thereof.

19. A method for fabricating an electronic device, the method comprising:
forming an n-type diamond layer;
depositing a nanostructured carbon layer that is doped with nitrogen, wherein the nanostructured carbon layer comprises an average grain size in a range from 10 nm to 1000 nm and a plurality of grain boundaries that are incorporated with the nitrogen, and wherein the nanostructured carbon layer is on the n-type diamond layer; and
depositing a metal contact layer on the nanostructured carbon layer, wherein the metal contact layer and the nanostructured carbon layer form a contact structure in conductive electrical communication with the n-type diamond layer.

20. The method of claim 19, further comprising cleaning a surface of the n-type diamond layer before said depositing of the nanostructured carbon layer.

21. The method of claim 19, wherein said depositing of the nanostructured carbon layer that is doped with nitrogen comprises a plasma-enhanced chemical vapor deposition (PECVD) process.

22. The method of claim 21, wherein a gas mixture used to deposit the nanostructured carbon layer during the PECVD process comprises at least 50% nitrogen.

23. The method of claim 21, wherein a gas mixture used to deposit the nanostructured carbon layer during the PECVD process comprises at least 70% nitrogen.

24. The method of claim 23, wherein the gas mixture used to deposit the nanostructured carbon layer during the PECVD process further comprises argon.

25. The method of claim 23, wherein the gas mixture used to deposit the nanostructured carbon layer during the PECVD process comprises at least 10% hydrocarbon.

26. The method of claim 25, wherein the hydrocarbon comprises methane.

27. An electronic device comprising:
a diamond layer;
a nanostructured carbon layer that is doped with nitrogen, the nanostructured carbon layer comprising an average grain size in a range from 10 nm to 1000 nm and a plurality of grain boundaries that are incorporated with the nitrogen, wherein the nanostructured carbon layer is on the diamond layer; and
a metal contact layer on the nanostructured carbon layer, wherein the metal contact layer and the nanostructured carbon layer form a contact structure in conductive electrical communication with the diamond layer.

28. The device of claim 27, wherein the nanostructured carbon layer comprises n-type conductivity.

29. The device of claim 28, wherein the nanostructured carbon layer comprises a nitrogen concentration in a range from about $1\times10^{19}$ cm$^{-3}$ to about $1\times10^{20}$ cm$^{-3}$.

30. The device of claim 27, wherein the nanostructured carbon layer comprises an average grain size in a range from about 10 nm to about 1000 nm.

31. The device of claim 27, wherein the diamond layer comprises a thickness in a range from about 500 nm to about 300 μm.

* * * * *